United States Patent
Leigh et al.

(10) Patent No.: US 10,809,466 B2
(45) Date of Patent: Oct. 20, 2020

(54) SWITCH SUB-CHASSIS SYSTEMS AND METHODS

(71) Applicant: HEWLETT PACKARD ENTERPRISE DEVELOPMENT LP, Houston, TX (US)

(72) Inventors: Kevin Leigh, Houston, TX (US); Everett Salinas, Pasadena, TX (US); John Franz, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/192,445

(22) Filed: Nov. 15, 2018

(65) Prior Publication Data

US 2020/0158963 A1    May 21, 2020

(51) Int. Cl.
| | |
|---|---|
| *G02B 6/38* | (2006.01) |
| *G02B 6/36* | (2006.01) |
| *H01R 12/70* | (2011.01) |
| *G02B 6/44* | (2006.01) |

(52) U.S. Cl.
CPC ......... *G02B 6/3897* (2013.01); *G02B 6/4452* (2013.01); *H01R 12/7005* (2013.01)

(58) Field of Classification Search
CPC . G02B 6/3897; G02B 6/4452; H01R 12/7005
USPC ............ 385/56, 58, 63, 65, 75–77, 92
See application file for complete search history.

(56) References Cited

U.S. PATENT DOCUMENTS

| | | | |
|---|---|---|---|
| 6,025,989 A | 2/2000 | Avd | |
| 6,567,274 B1 | 5/2003 | Tusan et al. | |
| 7,331,717 B2 * | 2/2008 | Kiani | G02B 6/3897 385/53 |
| 7,355,852 B2 | 4/2008 | Pfahnl | |
| 7,873,056 B2 | 1/2011 | Higuchi | |
| 8,416,570 B2 | 4/2013 | Zeng | |
| 8,798,431 B2 | 8/2014 | Julien | |
| 10,571,635 B1 | 2/2020 | Leigh et al. | |
| 2015/0098173 A1 | 4/2015 | Leigh et al. | |
| 2015/0323754 A1 * | 11/2015 | Leigh | G02B 6/43 385/14 |
| 2017/0257970 A1 | 9/2017 | Alleman et al. | |
| 2017/0303439 A1 | 10/2017 | Cader et al. | |

(Continued)

OTHER PUBLICATIONS

"ViaLiteHD Fibre Optic Link System 3U chassis," Pulse Power & Measurement Ltd., May 17, 2016, <https://www.vialite.com/wp-content/uploads/2016/05/ViaLiteHD-3U-Chassis-Handbook-HRK3-HB-6.pdf >.

*Primary Examiner* — Kaveh C Kianni
*Assistant Examiner* — Hung Q Lam
(74) *Attorney, Agent, or Firm* — Hewlett Packard Enterprise Patent Department

(57) ABSTRACT

Switch sub-chassis systems and methods for rack-scale servers are disclosed. A switch sub-chassis is arranged for modular installation in an enclosure and includes structural support features that allow multiple hot-serviceable line-cards and an integrated high-density optical fiber connectivity within the sub-chassis. Various features of the switch sub-chassis and associated line-cards allow liquid-electro-optical blindmate of the line-cards so that the line-cards are serviceable, allow high-density and complex fiber shuffle assemblies support, and facilitate ease of installation and/or servicing of fiber assemblies.

10 Claims, 20 Drawing Sheets

(56) References Cited

U.S. PATENT DOCUMENTS

2017/0325358 A1 11/2017 Franz et al.
2018/0120525 A1 5/2018 Leigh et al.

* cited by examiner

SWITCH SUB-CHASSIS SYSTEMS AND METHODS

BACKGROUND

This application generally relates to switches for rack-scale servers, and more particularly to switch sub-chassis systems and methods.

Large-scale computing systems typically use thousands of interconnected nodes that collaborate to process tasks on multiple levels. The interconnected nodes can be configured to collaborate at the operating system level or to run as a cluster, for example, to allow multiple nodes to share the workload associated with processing incoming requests. The nodes in the computing system are connected together by network cables plugged into multiport switches at the node level that collectively establish the network topology of the computing system. The network cables are typically connected between ports of switches in specific configurations that allow for data transfer through the network topology.

The network cables interconnecting ports of the network devices have several disadvantages that negatively impact the performance and serviceability of the network topology. For example, network cables are required to be removed from the switch connection ports to allow for service of the switch, and the repeated removal and reconnection of the network cables to the switch ports is known to cause human errors, which requires identifying and reconfiguring cables for correct connections. In some other cases, network cables themselves could fail, which requires replacing the network cable terminating connector or even the network cable as a whole. If the network cable as a whole is replaced, often times operators will simply cut the ends off the damaged network cable and leave the cable inactive in the cable bundle, as replacing the network cable associated with a cable bundle can cause damage to other network cables running through walls, in cable trays, under raised floors, etc. and therefore exacerbate the initial problem of having one network cable not working properly. Over time this "cut and leave" practice results in multiple unused and unmarked network cables without end connectors taking up space in the topology infrastructure.

Another disadvantage of current network cable connection practice is that network cables must be removed before the network switch or components of the switch can be repaired or replaced. As such, in a typical forty-port network switch with a technical failure, forty network cables connected to the switch ports need to be unplugged from their respective switch ports to allow for a new or repaired switch or switch component to be installed. Further, once the new or repaired switch or component is installed, the forty network cables must then be reconnected to their respective switch ports to enable proper operation in the network topology. Errors, including human errors, can also occur during switch upgrades. In various circumstances, cable reconnection can be incorrect and the installation will not be fully operational. System downtime commonly translates into operational expenses and loss of revenues for organizations.

Therefore, the ability to repair or replace an internal component of a network switch without requiring the associated network switch cable connections to be unplugged is desired.

The description provided in the background section should not be assumed to be prior art merely because it is mentioned in or associated with the background section. The background section may include information that describes one or more aspects of the subject technology.

BRIEF DESCRIPTION OF DRAWINGS

The accompanying drawings, which are included to provide further understanding and are incorporated in and constitute a part of this specification, illustrate disclosed implementations and together with the description serve to explain the principles of the disclosed implementations. In the drawings.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

Switch sub-chassis systems and methods for rack-scale servers are disclosed. In accordance with various aspects of the subject disclosure, a switch sub-chassis is provided for modular installation in a main chassis (sometimes referred to herein as an enclosure). The switch sub-chasses include structural support features that allow multiple hot-serviceable line-cards (e.g., each having one or more switch application-specific integrated circuits (ASICs)) and an integrated high-density optical fiber connectivity within the sub-chassis.

Various features of the disclosed switch sub-chasses and associated line-cards allow high power delivery to the ASICs of the line-cards directly from the midplane of the enclosure, allow efficient liquid cooling of the ASICs and corresponding electronics (e.g., including power regulators), allow liquid-electro-opto blindmate of the line-cards so that the line-cards are serviceable, allow high-density and complex fiber shuffle assemblies support, and facilitate ease of installation and/or servicing of fiber assemblies.

Example Switch

Figure 1:
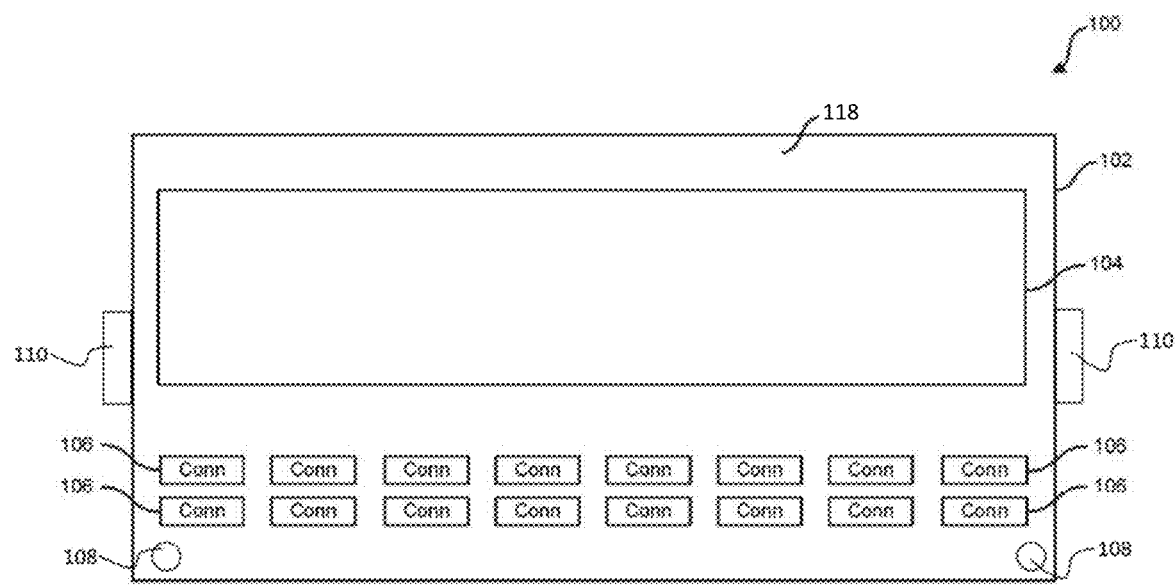
FIG. 1 illustrates an example switch, in accordance with various aspects of the disclosure.

FIG. 1 illustrates an example switch in accordance with aspects of the subject disclosure. The disclosed switch provides a hot-swappable solution for network switches that allows for replacement of network switches or network switch components without requiring disconnection of the network cables connected to the switch. The disclosed switch decouples switch faceplate network cable connectors from internal components of the network switch so that, for example, the switch ASIC board or module is provided in a hot-swappable line-card that can be removed from the switch without disconnecting the switch network cables. This decoupling is achieved by providing a switch sub-chassis with disconnectable internal optical blindmate connectors for connection between the faceplate network cable connectors and the line-card ASIC, internal liquid blindmate connectors for liquid cooling connections to installed line-cards, and features that allow internal blindmate electrical connections directly to the enclosure midplane. These modular blindmateable connections allow for line-cards (e.g., ASIC modules and other switch internal components) to be serviced (e.g., installed or repaired) without disconnecting network connection cables from the faceplate of the switch sub-chassis.

In the example of FIG. 1, a switch 100 is provided that includes a switch sub-chassis 102. Switch sub-chassis 102 is configured to be mounted in a main chassis (e.g., an enclosure) in a server rack for coupling of switch 100 to blades mounted in the rack. As shown in FIG. 1, switch sub-chassis 102 also includes fluid ports 108 and mounting structures 110 (sometimes referred to herein as mechanical retention features) for securing switch sub-chassis 102 to an enclosure that contains blades and shared resources such as a power/management midplane, power supplies, enclosure managers, etc.

As shown in FIG. 1, switch sub-chassis 102 includes a faceplate 118 having a plurality of network cable connection ports 106. The faceplate 118 may also include one or more labels and/or one or more indicators such as light-emitting diodes and light pipes that illuminate to indicate designations for the connectors 106. In the example of FIG. 1, a single line-card 104 (e.g., a hot-swappable ASIC switch module) is removably positioned within the switch sub-chassis 102 (e.g., in a line-card slot in the switch sub-chassis). Line-card 104 may be slidably received in (and removed from) the switch sub-chassis 102 (e.g., by inserting the line-card 104 into the line-card slot in switch sub-chassis 102 along an axis that is perpendicular to the faceplate 118 of the switch sub-chassis 102). The line-card slot in the switch sub-chassis 102 is formed by a recess that is sized and configured to receive the line-card 104 therein. Network cable connectors 106, for example, may include receptacle connector portions of network connectors, such as MPO-type optical cable connectors. Other types of network cable connectors 106, such as MXC or LC-Duplex optical fiber cable connectors, may be used to connect to other devices in a computer network topology.

Figure 2:
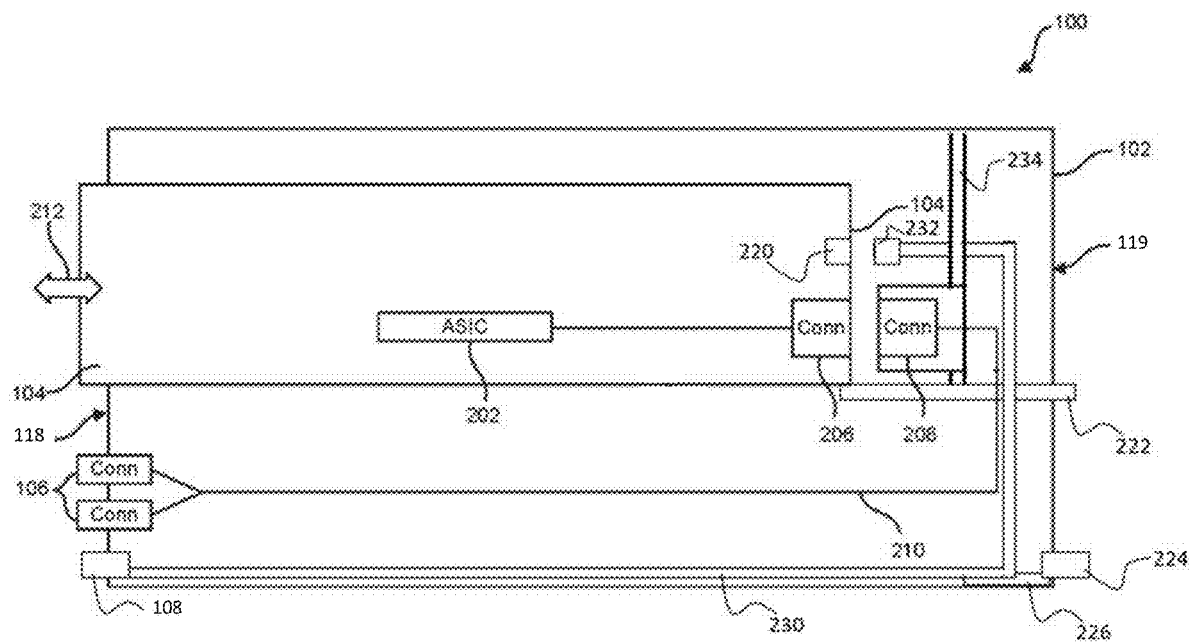
FIG. 2 illustrates a schematic side view of an example switch, in accordance with various aspects of the disclosure.

FIG. 2 illustrates a side schematic view of switch 100 in accordance with aspects of the disclosure. The side schematic view of switch 100 shows line-card 104 partially inserted into the switch sub-chassis 102 in the direction of arrows 212, which is perpendicular to the faceplate 118 of the switch sub-chassis 102. As shown in the example of FIG. 2, line-card 104 may include an ASIC chip or board 202 that is connected to a line-card optical blindmate connector 206 and/or a line-card electrical blindmate connector 222 via a communication link. The communication link may, for example, include a multichannel signal transmission medium configured to communicate electronic signals between the ASIC chip 202 and line-card optical blindmate connector 206 and/or line-card electrical blindmate connector 222.

As shown, line-card optical blindmate connector 206 may blindmate with a switch sub-chassis optical blindmate connector 208. Switch sub-chassis optical blindmate connector 208 may be coupled via optical fibers 210 to connectors 106 at the faceplate 118 of switch sub-chassis 102.

Line-card electrical blindmate connector 222 may extend beyond line-card optical blindmate connector 206 and pass through and/or under one or more structures of switch sub-chassis 102 for direct electrical blindmate connection to an enclosure midplane as described in further detail hereinafter.

Line-card optical blindmate connector 208 may be mounted to a fence bracket 234 that is located between faceplate 118 and front-end bulkhead 119 of switch sub-chassis 102. Fence bracket 234 may include features such as notches and/or cutouts that allow line-card electrical blindmate connector 222, line-card liquid blindmate connector 220 and/or switch sub-chassis liquid blindmate connector 232 to pass through and/or under the fence bracket when a line-card 104 is installed in the switch sub-chassis.

FIG. 2 also shows how line-card 104 may include a line-card liquid blindmate connector 220 configured to blindmate with a switch sub-chassis liquid blindmate connector 232 that is fluidly coupled, by fluid supply lines 230, with fluid port 108 for fluid connection to liquid lines of a server rack. FIG. 2 also shows how switch sub-chassis 102 may be provided with a sub-chassis management circuitry 226. Sub-chassis management circuitry 226 may be coupled to a connector 224 for direct electrical blindmate to the enclosure midplane or one or more blades mounted in the enclosure. Switch sub-chassis 102 may include additional interior and/or exterior connectors as described in further detail hereinafter.

Sub-chassis management circuitry 226 may include a management board and/or one or more management controllers (e.g., ASICs) that communicate, via connector 224, with enclosure managers about line-cards, fiber shuffles, and/or leak detection (e.g., via a drip pan and sensor rope as described in further detail hereinafter).

Line-card 104 may be inserted into switch sub-chassis 102 in the direction of arrows 212 from the faceplate 118 toward the front-end bulkhead 119. Line-card 104 may be removed from the switch sub-chassis 102 in the direction of arrows 212 away from the front-end bulkhead 119 toward the faceplate 118. This insertion and removal process may be guided by mechanical guide features positioned within switch sub-chassis 102 that are configured to engage and guide line-card 104 into a desired position that facilitates proper blindmate connection between the various liquid, electrical, and optical blindmate connectors.

In the example of FIG. 2 connectors 222 and 224 are positioned at or near the front-end bulkhead 119 of switch sub-chassis 102, where at or near the front-end bulkhead 119 is defined as being closer to the front-end bulkhead 119 than the faceplate 118. Similarly, faceplate connectors 106 and liquid ports 108 are positioned at or near the faceplate 118 of switch sub-chassis 102, where at or near the faceplate 118 is defined as being closer to the faceplate 118 than the front-end bulkhead 119.

Line-card 104 may, for example, be a liquid-cooled electrical, optical, or combination electrical and optical ASIC module. For example, the line-card 104 may, for example, be a combination electrical and optical ASIC module, in which the ASIC chip 202 may be configured to output electrical signals that are converted into an optical signal before leaving the switch sub-chassis 102. For example, an optical transceiver may be positioned in the signal communication path at a location between the ASIC chip 202 and the line-card optical blindmate connector 206 and be configured to receive an electrical signal at an input, and output a corresponding optical data signal that continues to propagate through the remainder of the signal transmission path as an optical signal.

The optical transceiver, also called fiber optic transceiver or optical transceiver module, is a hot-pluggable device used in high-bandwidth signal communication applications. Optical transceivers have an electrical interface on one side and an optical interface on the other side so that signals passing through the optical transceiver are converted from electrical to optical or optical to electrical depending on the signal's direction of travel. Therefore, an optical transceiver operates as a opto-electronic converter that converts an electrical signal into an optical signal or an optical signal into an electrical signal. In an example in which ASIC chip 202 outputs electrical signals, an optical transceiver may be positioned anywhere in the signal path between ASIC chip 202 and the line-card optical blindmate connector 206.

As noted above, line-card 104 may be an all optical module. For example, ASIC chip 202 may include a high-density optical engine under cold-plates that outputs an optical signal that is received by an internal line-card communication link and communicated to connector 206. The optical signal may be further communicated through optical connectors 206 and 208, and through an optical communication link 210 to optical network cable connectors 106 and/or other optical connectors of the switch sub-chassis.

In the example embodiment shown in FIGS. 1 and 2, line-card 104 is decoupled from the network cable connectors 106 on the faceplate 118 of the switch sub-chassis 102. This enables line-card 104 to be removed from switch sub-chassis 102 without disconnecting signal communication cables or wires that may be connected to network cable connectors 106. As such, the example configuration illustrated in FIGS. 1 and 2 allows for a line-card 104 to be repaired or replaced without removing corresponding network cable connectors that communicate signals to and from line-card 104.

Figure 3:
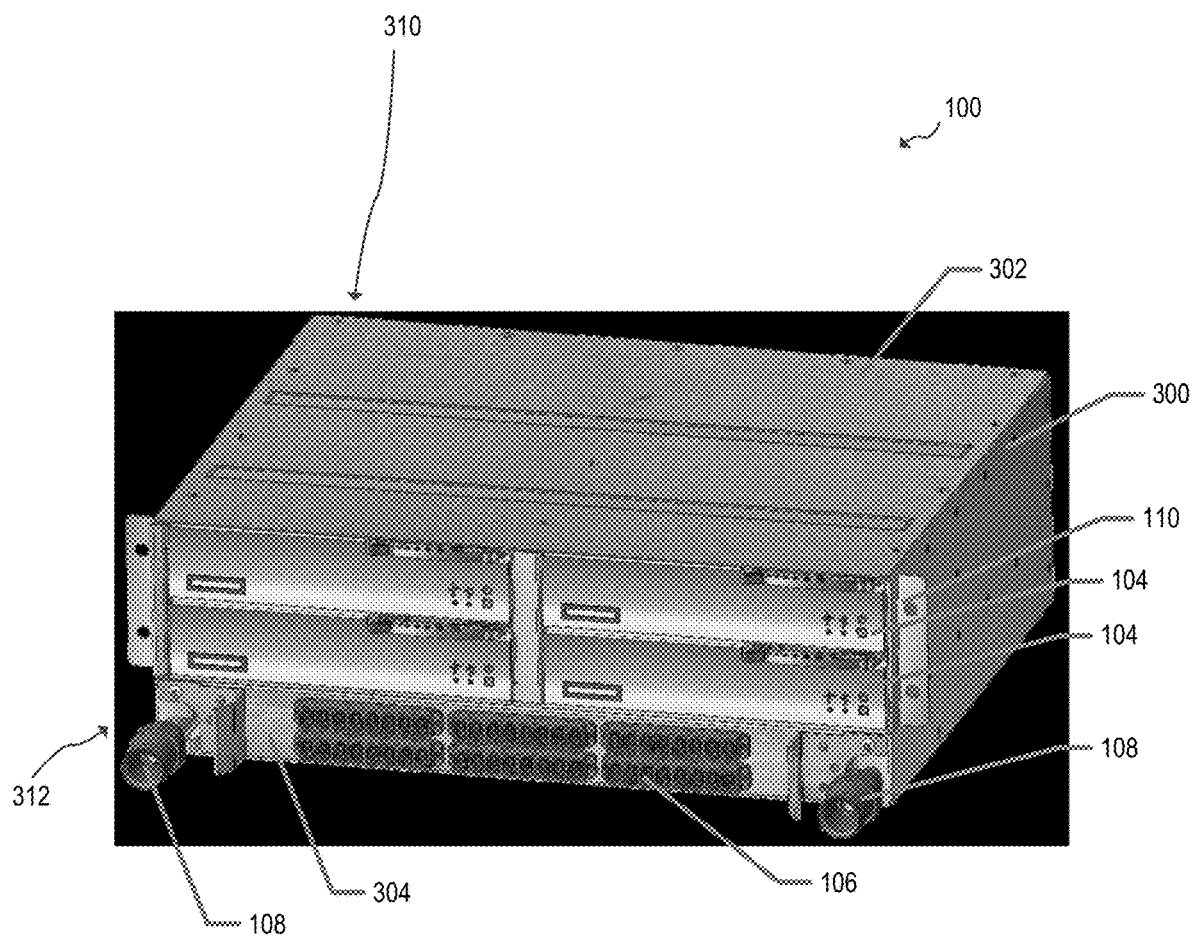
FIG. 3 illustrates a perspective view of an example switch, in accordance with various aspects of the disclosure.

FIG. 3 illustrates a perspective view of an example switch 100 that includes four removable line-cards 104 (e.g., each similar to line-cards 104 shown in FIGS. 1 and 2). Each line-card 104 may include one, two, or more than two switch ASICs packaged into one field serviceable switch sub-chassis. In the example configuration of FIG. 3, network cable connectors 106 are positioned on a rear side 312 (corresponding to faceplate 118) of a switch sub-chassis having an outer surface formed by a base pan 300 and a lid 302. A front side 310 (corresponding to front-end bulkhead 119) includes various blindmate connectors as described in further detail hereinafter. Mechanical retention features 110 are formed on or attached to base pan 300 (e.g., including one ear on a rear-end of each of two sidewalls of base pan 300 as shown with openings for receiving mounting screws or other attachment elements) for securing the base pan to a main chassis. In the example of FIG. 3, four serviceable line-cards 104 are removably positioned in the switch sub-chassis at a position above (respectively) the network connectors 106, which are mounted on a faceplate 304. Faceplate 304 and fluid ports 108 are disposed at the rear side 312 of switch sub-chassis 102.

Line-cards 104 of FIG. 3 are independently removable from the switch sub-chassis. In this example, any one or more of line-cards 104 may be removed from the switch sub-chassis without disconnecting any of data transmission cables or wires that may be connected to the network cable connectors 106. In this way, in some scenarios, ASIC chips 202 and/or other components of a line-card 104 may be removed or replaced without disconnecting data transmission cables or wires that may be connected to the network cable connectors 106.

Figure 4:
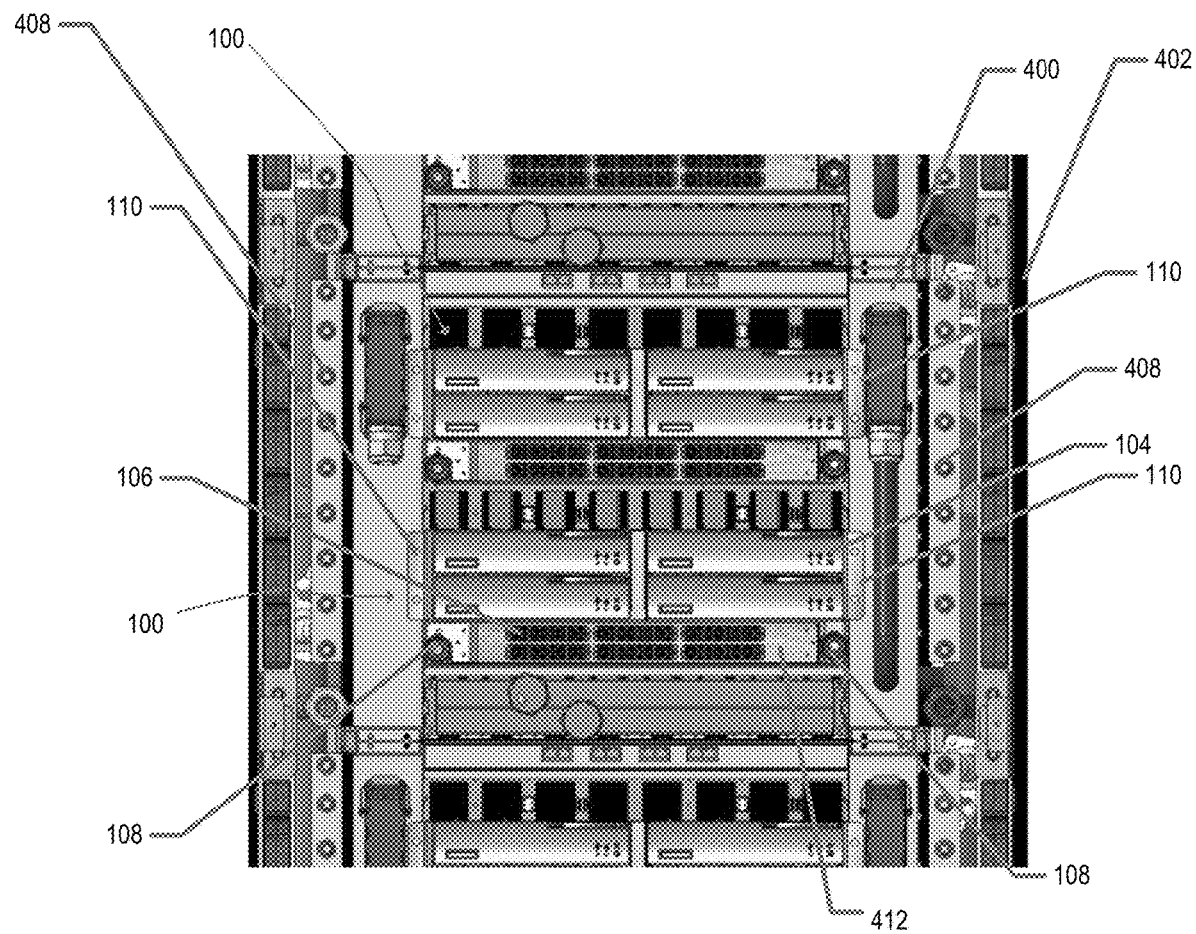
FIG. 4 illustrates a rear view of a portion of a rack having multiple blindmateable switch sub-chasses mounted in a main chassis, in accordance with various aspects of the disclosure.

FIG. 4 shows a face-on rear view of a server rack in which two switches 100 are mounted. As shown, mounting structures 110 of two switch sub-chasses that each include four line-cards 104 and a fiber shuffle tray 412 attach the switch sub-chasses to a main chassis 400 in a server rack 402. In this view, rack liquid lines 408 that can be fluidly coupled to liquid ports 108 of each of the switch sub-chasses mounted in main chassis 400 (e.g., with an external fluid line) are shown.

Figure 5:
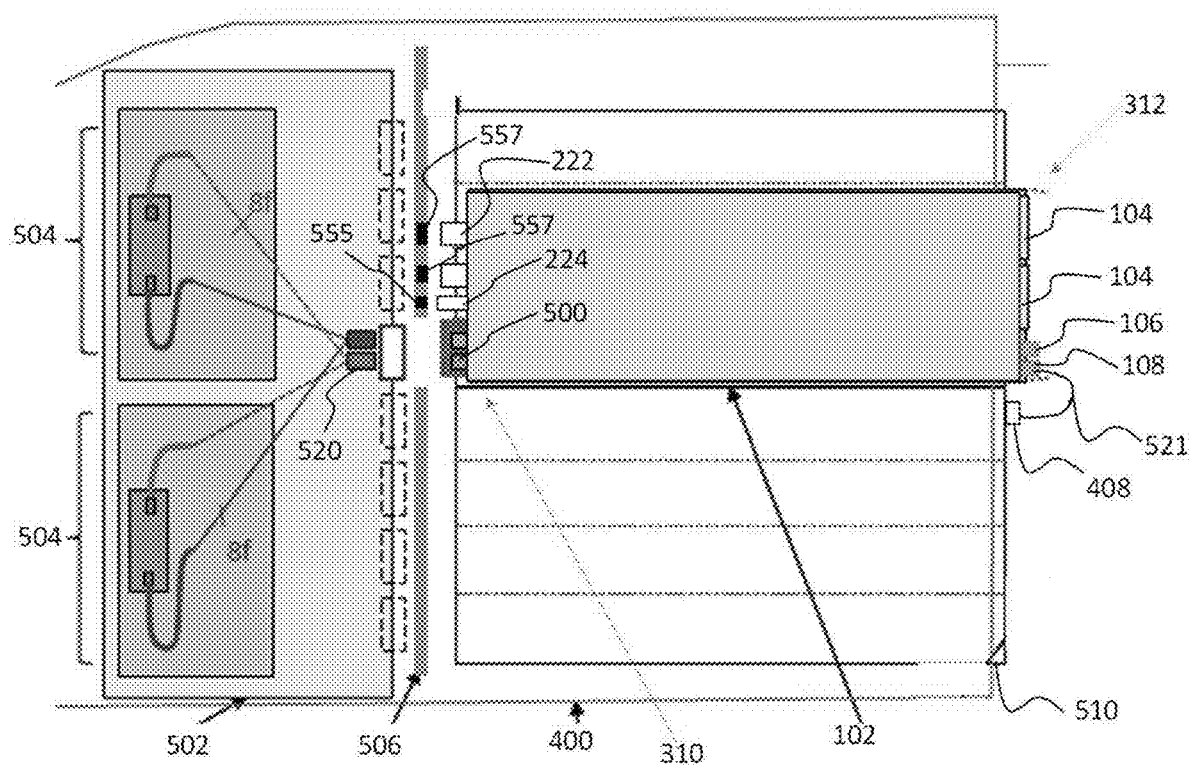
FIG. 5 illustrates a schematic side view of a switch sub-chassis installed in a main chassis of a rack having a blade, in accordance with various aspects of the disclosure.

FIG. 5 shows a schematic side view of enclosure 400 in which a blade 502 mounted at the front of the enclosure can be seen. In this example, blade 502 includes two nodes 504 communicatively coupled to blade connectors 520. Switch sub-chassis 102 having line-cards 104 installed therein is partially installed in enclosure 400 in this example. At the enclosure midplane 506, connectors 224 of switch sub-chassis 102 and connectors 222 of line-cards 104 installed therein can blindmate to connectors 555 and 557, respectively, at the enclosure midplane 506. Optical blindmate connectors 500 may also be provided on switch sub-chassis 102 (e.g., for optical blindmate directly to blade connectors 520). In the example of FIG. 5, a fluid line 521 is coupled between fluid port 108 of sub-chassis 102 and rack liquid line 408.

Figure 6:
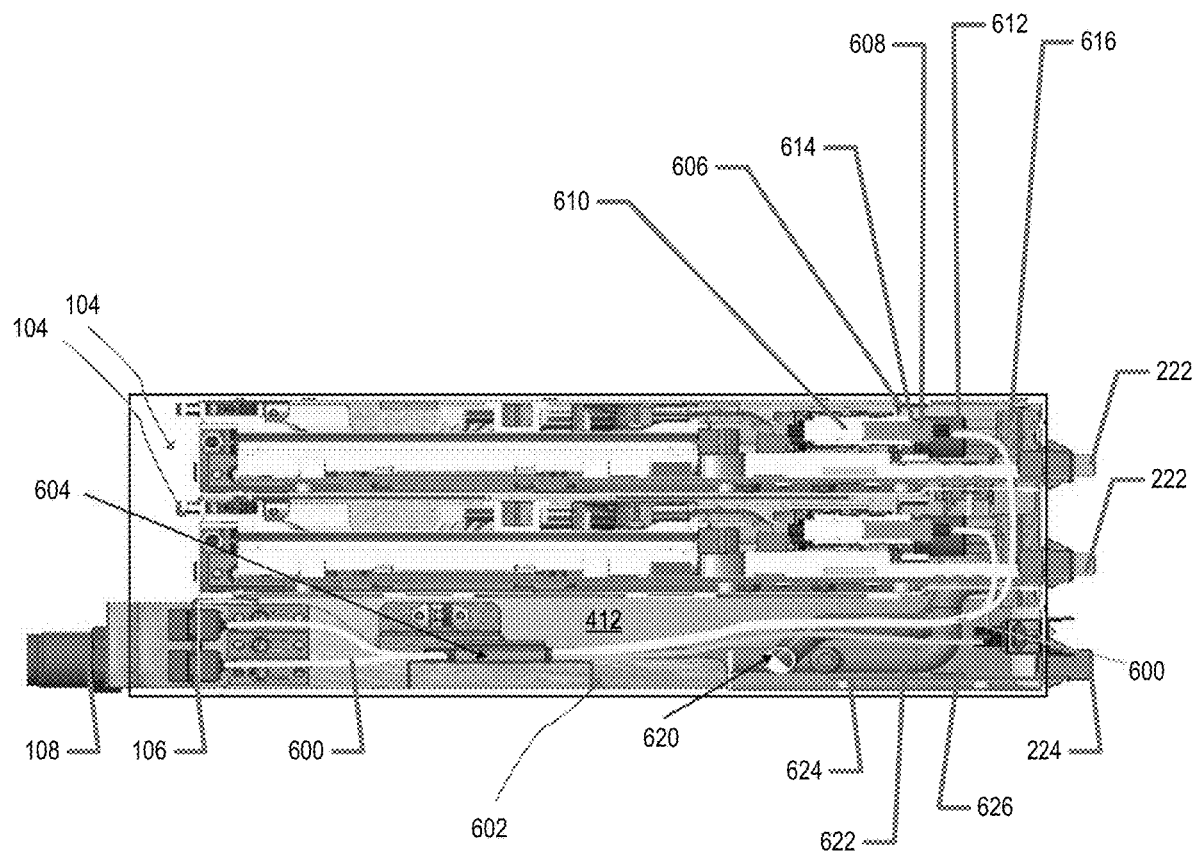
FIG. 6 illustrates a cross-sectional side view of a switch sub-chassis with installed line-cards, in accordance with various aspects of the disclosure.

FIG. 6 illustrates a cross-sectional side view of a switch 100 having two line-cards 104 installed therein. In the example of FIG. 6, it can be seen that switch sub-chassis 102 is a modularly blindmateable switch sub-chassis that includes a sub-chassis management board 624 having a management controller 626 (e.g., an ASIC) and having a management board connector 224 for direct blindmate to a midplane 506 of an enclosure 400. It can also be seen that connectors 106 may be implemented as (e.g., external) faceplate optical connectors in a fiber shuffle tray 412 (e.g., on a faceplate of the fiber shuffle tray). In this example, line-cards 104 are installed in corresponding line-card slots, each including optical blindmate connectors 608 (e.g., implementations of connectors 208 of FIG. 2), and liquid blindmate connectors 612 (e.g., implementations of connectors 232 of FIG. 2) for a line-card 104.

Faceplate liquid ports 108 are fluidly coupled to the liquid blindmate connectors 612 via fluid lines 230 (e.g., including a fluid supply line 620 and a fluid return line 622). Liquid blindmate connectors 612 for each line-card are disposed in a manifold 616 for that line-card and at least one other line-card. Liquid manifolds 616 may be part of a liquid line assembly and may be modularly attached to a front-end bulkhead of the base pan (as described in further detail hereinafter).

FIG. 6 also shows how fibers 600 may be provided in fiber shuffle tray 412 and coupled between the faceplate optical connectors 106 and the optical blindmate connectors 608 for each of the line-card slots. A shuffle stand 602 may include one or more fiber shuffle assemblies 604 that guide fibers 600 between connectors 106 and optical blindmate connectors 608. In the example of FIG. 6, line-cards 104 are fully installed in the switch sub-chassis 102 such that line-card liquid blindmate connectors 614 are fluidly coupled to switch sub-chassis liquid blindmate connectors 612, line-card optical blindmate connectors 610 (e.g., implementations of connectors 206 of FIG. 2) are optically coupled to optical blindmate connectors 608 on fence bracket 606, and it can be seen that management board connector 224 and line-card electrical connectors 222 protrude from the front bulkhead of switch sub-chassis 102 in this configuration for direct blindmate to the enclosure midplane 506.

Fence brackets 606 (e.g., implementations of fence bracket 234 of FIG. 2) can also be seen on which optical blindmate connectors 608 are mounted. As shown in FIG. 6, management board connector 224 is disposed at or near a front of the modularly blindmateable switch sub-chassis, faceplate optical connectors 106 and faceplate liquid ports 108 are disposed at or near a rear of the modularly blindmateable switch sub-chassis, and fence bracket 606 is disposed between the front and the rear of the modularly blindmateable switch sub-chassis.

Figure 7:
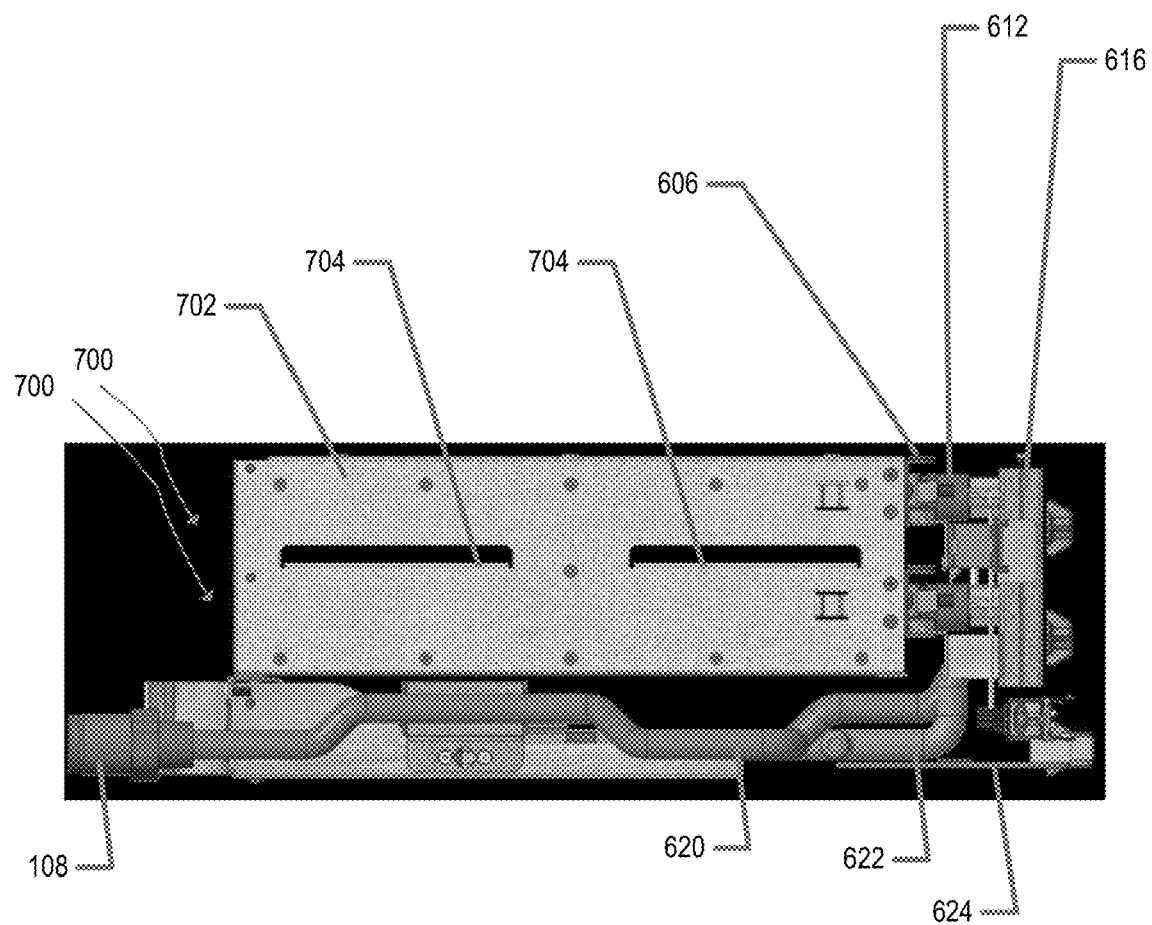
FIG. 7 illustrates a side view of a switch sub-chassis without installed line-cards, in accordance with various aspects of the disclosure.

FIG. 7 shows a cross-sectional side view of the switch sub-chassis of FIG. 6 in which the line-cards 104 and fiber shuffle tray 412 has been removed so that line-card slots 700 at least partially defined by a line-card cage assembly 702 can be seen. As shown, guide features 704 may be provided on the line-card cage assembly 702 to guide line-cards 104 for optical, liquid, and electrical blindmate connections to switch sub-chassis 102, enclosure midplane 506, and/or blades 502. Liquid supply line 620 and liquid return line 622 can also be seen running between faceplate fluid port(s) 108 and manifold 616, which houses switch sub-chassis liquid blindmate connectors 612. Fence bracket 606 of the line-card cage assembly 702 can also be seen in this view.

Figure 8:
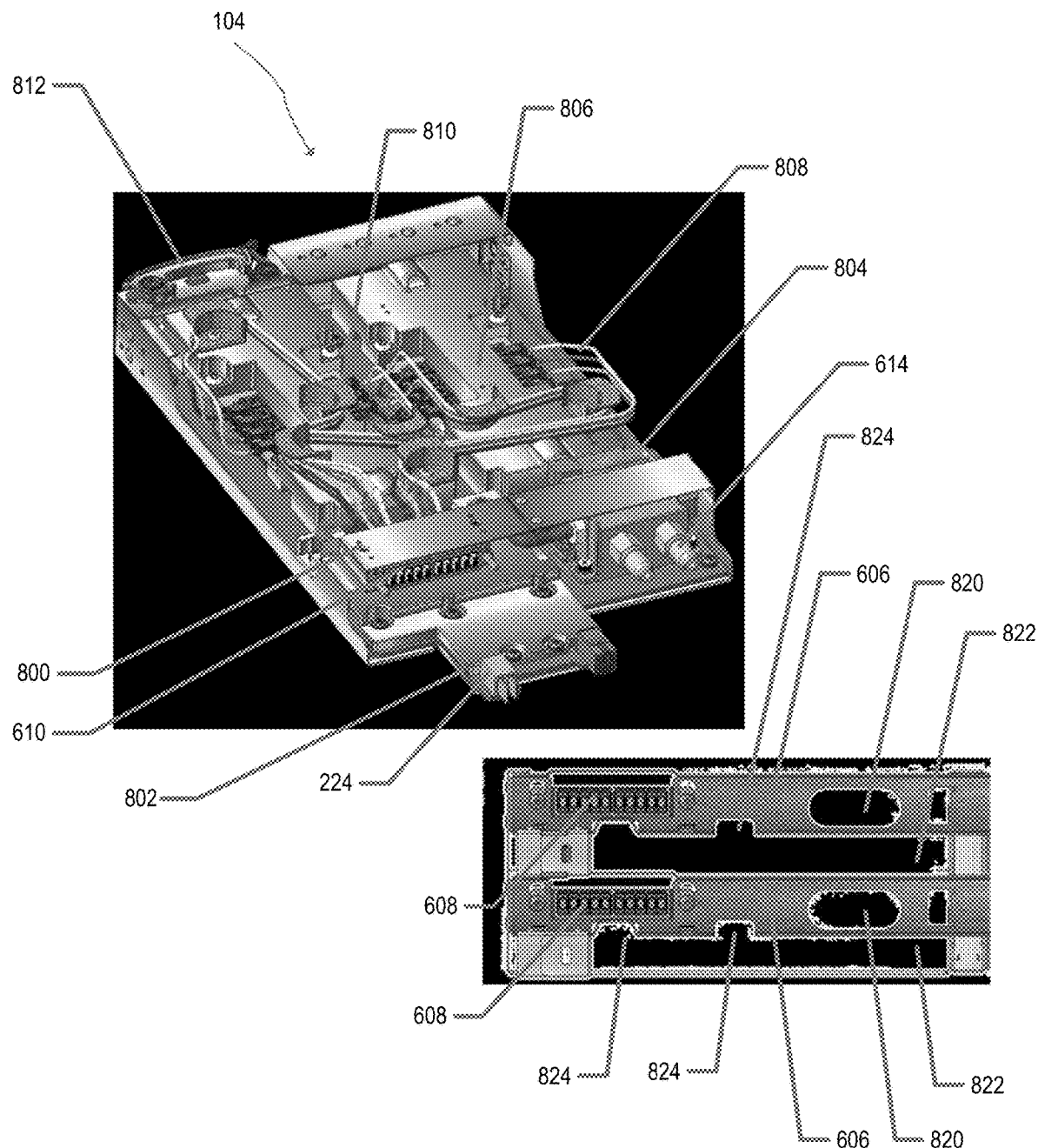
FIG. 8 illustrates a perspective view of a line-card in alignment with a portion of a fence bracket of a switch sub-chassis, in accordance with various aspects of the disclosure.

FIG. 8 shows a perspective view of a line-card 104 in relation to a portion of a fence bracket 606. As shown in FIG. 8, fence bracket 606 includes a cutout 822 for each of the two of the line-card slots 700 of FIG. 6, each cutout 822 configured to allow an electrical blindmate connector 224 of a line-card to pass under and beyond the fence bracket for direct electrical blindmate of the line-card to the midplane 506 of the enclosure 400. In this example, cutouts 822 each include notches 824 that allow multiple line-card electrical connectors 224 to pass under and beyond fence bracket 606 on an extension 802 that also passes into cutout 822 under fence bracket 606.

FIG. 8 also shows features of line-card 104 including handle latch 812, bracket 800 for line-card optical connector 610, line-card liquid blindmate connectors 614 arranged to pass through corresponding holes 820 in fence brackets 606 and coupled via line-card fluid lines 804 to coldplate 806 for ASIC chips 202 (see FIG. 2), and fibers 808 and fiber guides 810 for guiding fibers 808 between ASIC chips 202 and line-card optical blindmate connector 610. Switch sub-chassis optical blindmate connectors 608 mounted on fence bracket 606 are also shown.

Figure 9:
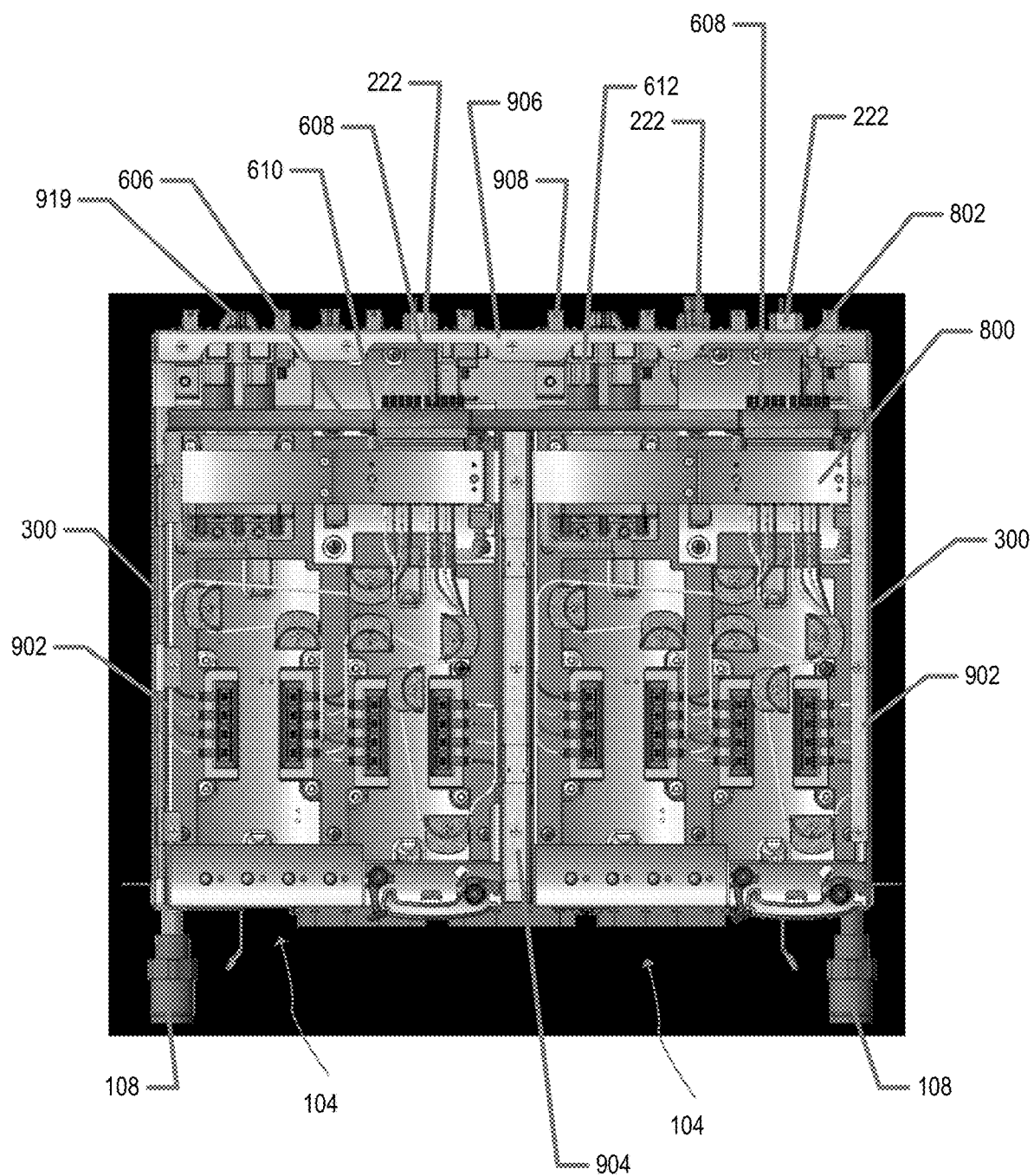
FIG. 9 illustrates a top view of a switch sub-chassis with a lid omitted for clarity, in accordance with various aspects of the disclosure.

FIG. 9 shows a top view of a switch sub-chassis in which lid 302 is removed and two line-cards 104 are mounted side by side therein. In the example of FIG. 9, line-card cage assembly 902 (e.g., an implementation of line-card cage assembly 702 of FIG. 7) is mounted in base pan 300 having a front-end bulkhead 906 (e.g., an implementation of front-end bulkhead 119) that includes initial alignment features 919 (sometimes referred to herein as initial guide features or sub-chassis initial alignment features) for mechanical blindmate of the base pan to the enclosure midplane 506 (see FIG. 5) for installation of sub-chassis 102 in an enclosure, and includes optical blindmate connectors 908 attached to the front-end bulkhead 906, for optical blindmate to blades 502. In the top view of FIG. 9, line-card electrical blindmate connectors 222 can be seen protruding through front-end bulkhead 906 of base pan 300. Fence bracket 606 can also be seen extending across the line-card cage assembly, and bridge brackets 904 can also be seen attaching side-by-side portions of the line-card cage assembly. In the configuration of FIG. 9, extension 802 of each line-card 104 can be seen extending under and beyond fence bracket 606. Front-end bulkhead optical blindmate connectors 908 may be implementations of optical blindmate connectors 500 of FIG. 5.

Figure 10:
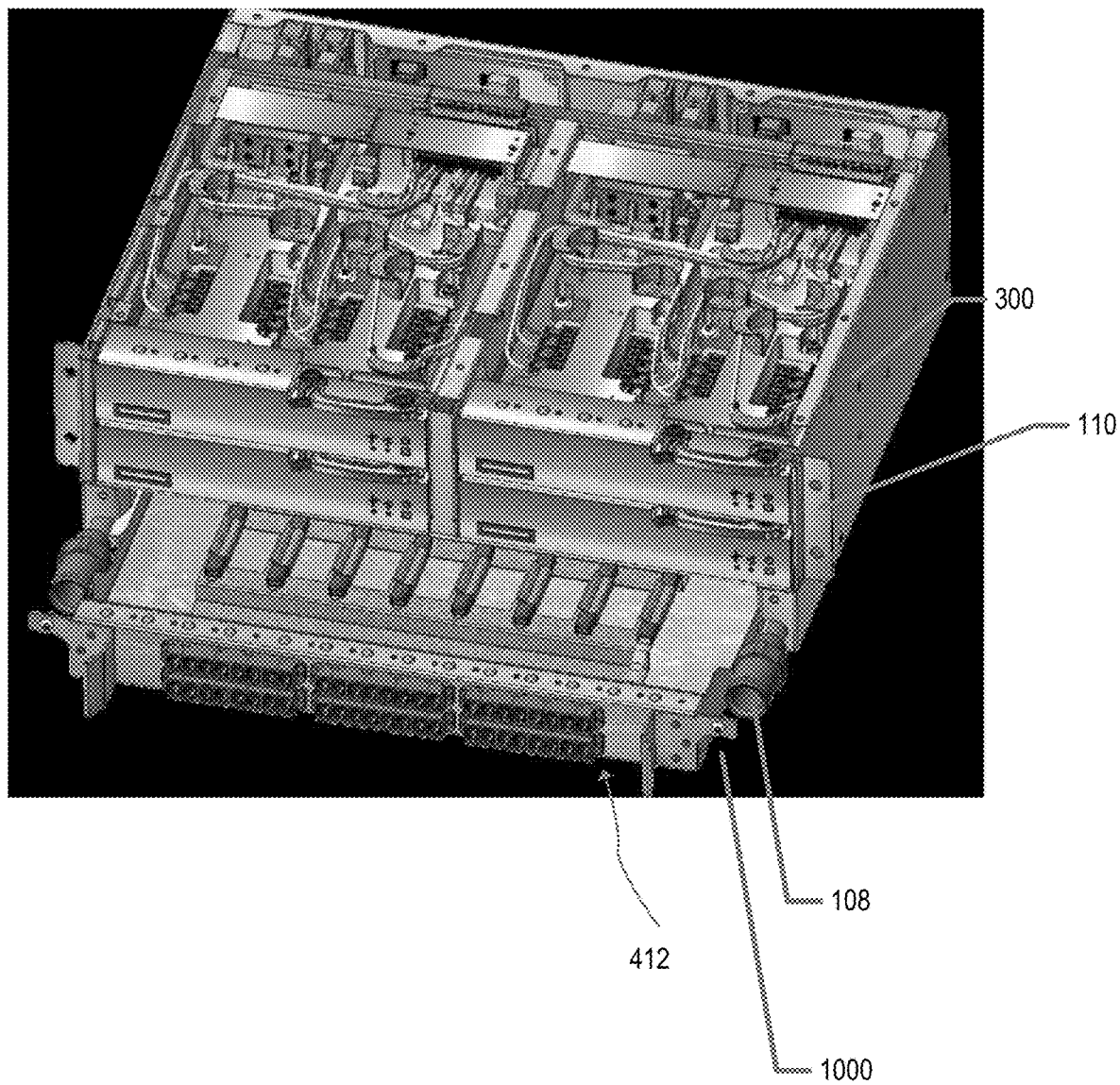
FIG. 10 illustrates a top perspective view of a switch sub-chassis with a lid omitted and a fiber shuffle tray partially removed, in accordance with various aspects of the disclosure.
Figure 11:
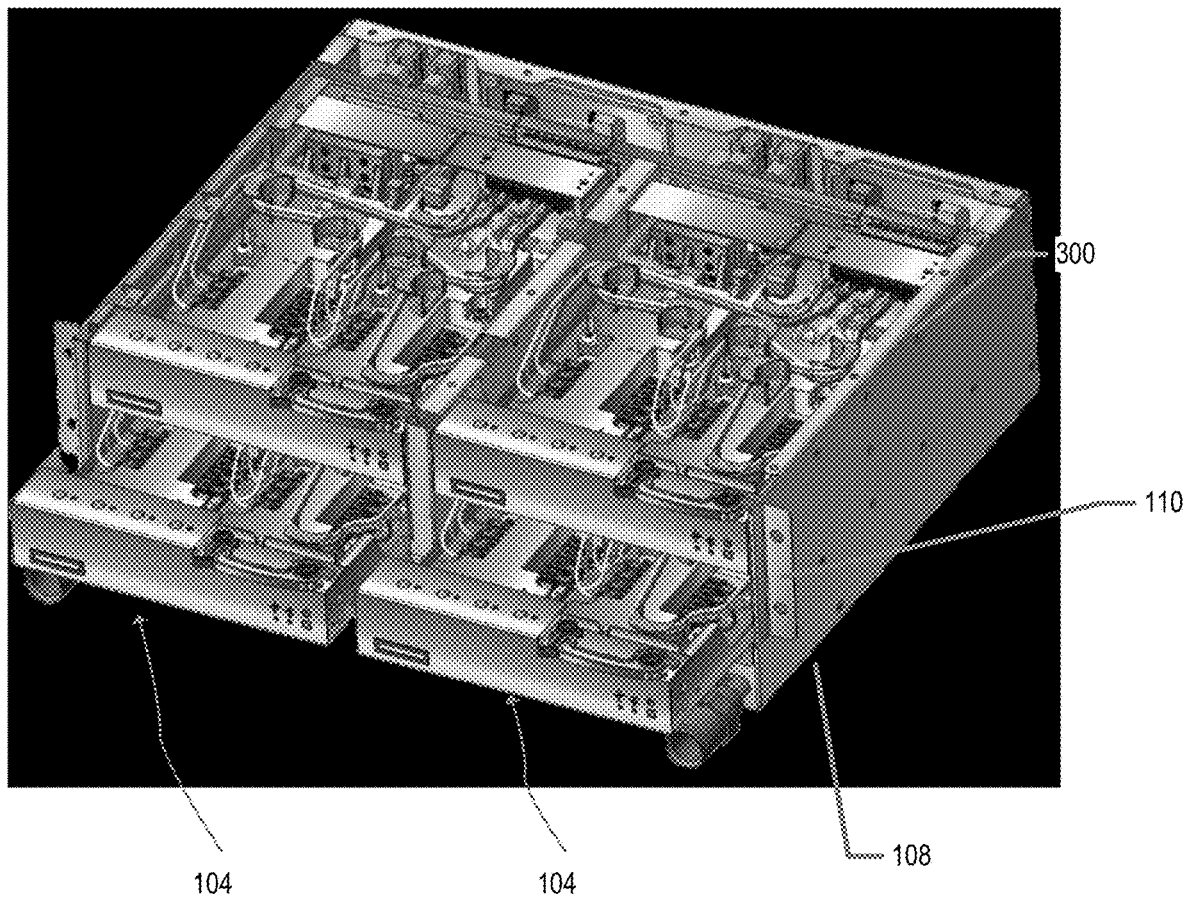
FIG. 11 illustrates a top perspective view of a switch sub-chassis with a lid omitted and two line-cards partially removed, in accordance with various aspects of the disclosure.

FIGS. 10 and 11 respectively illustrate how a fiber shuffle tray 412 and/or line-cards 104 can be partially or fully removable from switch sub-chassis 102 without removal of the other. In FIG. 10, a cutout 1000 on the mounting feature for fiber shuffle tray 412 to accommodate a liquid port 108, is also shown.

Figure 12:
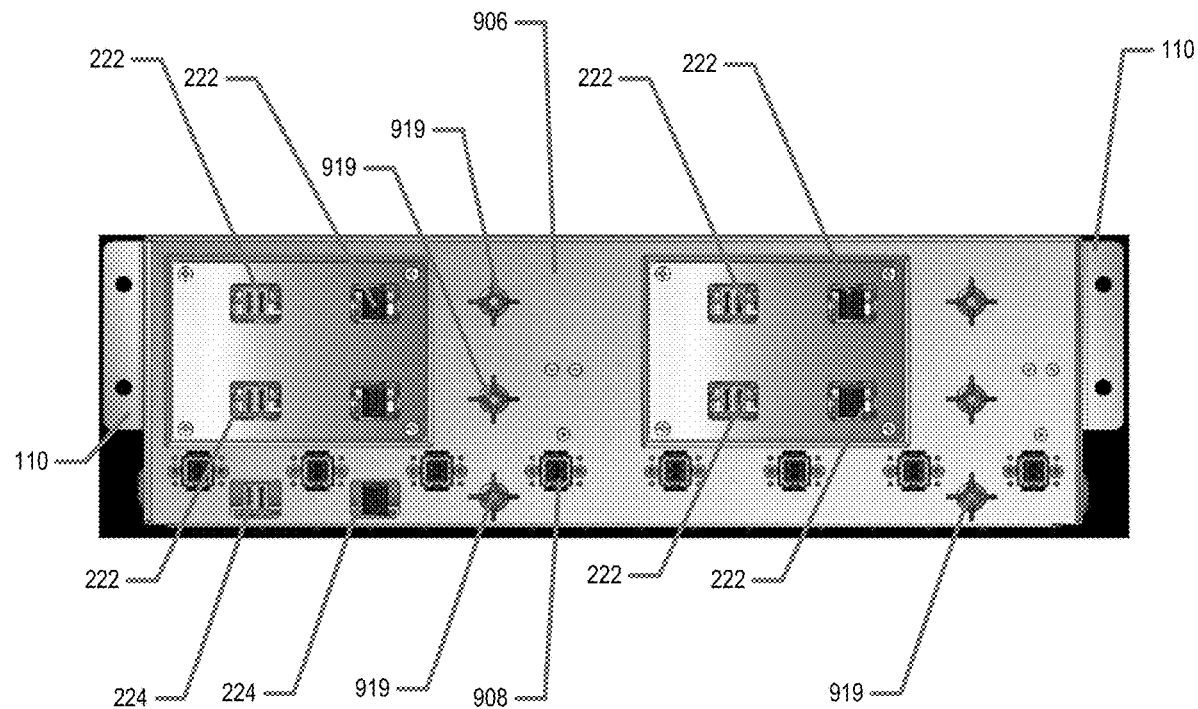
FIG. 12 illustrates a face-on view of a front-end bulkhead of a switch sub-chassis, in accordance with various aspects of the disclosure.

FIG. 12 shows a front view of switch sub-chassis 102 in which management connectors 224 and line-card electrical blindmate connectors 222 of four installed line-cards are shown protruding though openings in front-end bulkhead 906. Initial guidance features 919 (e.g., alignment holes with guide features as shown) and switch sub-chassis optical blindmate connectors 908 are also shown.

Figure 13:
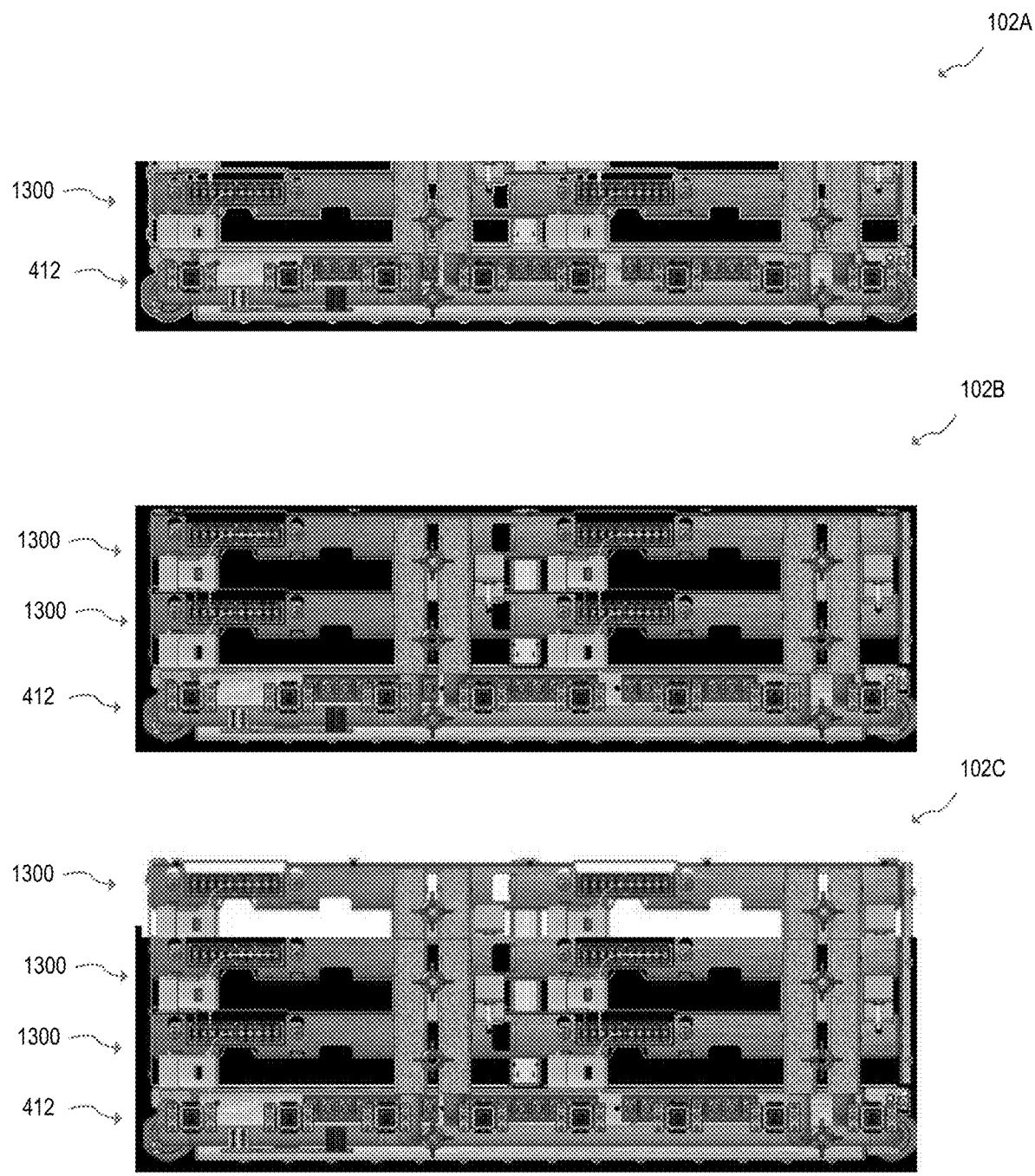
FIG. 13 illustrates switch sub-chasses with various numbers of rows of line-card slot pairs, in accordance with various aspects of the disclosure.

In various examples shown and described herein, switch sub-chassis 102 is shown having two rows of two line-card slots for receiving four line-cards 104. However, it should be appreciated that these examples are illustrative and other arrangements are contemplated. For example, FIG. 13 shows a switch sub-chassis 102A having a fiber shuffle tray 412 and one row 1300 of two side-by-side line-card slots (e.g., forming a line-card slot pair), a switch sub-chassis 102B having a fiber shuffle tray 412 and two rows 1300 of side-by-side line-card slot pairs, and a switch sub-chassis 102C having a fiber shuffle tray 412 and three rows 1300 of side-by-side line-card slot pairs. Accordingly, switch sub-chasses 102 can be scalable for various implementations in which the line-card cage assembly 902 includes one, two, three, four, or more than four vertically stacked rows 1300 of line-card slots 700 (e.g., in pairs in each row as shown).

In another example, a switch sub-chassis may be provided in which two, three, four, or more than four single line-card slots 700 are vertically stacked (e.g., in one-by-four configuration). In this type of vertically stacked arrangement, the faceplate connectors 106 may be disposed alongside the vertically stacked line-card slots (e.g., on a removable fiber shuffle tray that can be inserted into the base pan adjacent to the edges of one or more vertically stacked installed line-cards) or under the vertically stacked line cards (e.g., as in the two-by-two arrangement of FIG. 3). A one-by-four configuration may be more suitable for standard rack widths, whereas a two-by-two configuration such as that shown with switch sub-chassis 102B of FIG. 13 may take advantage of wider racks and may provide easier to route liquid lines and drip pans in the sub-chassis.

Moreover, in the various examples described herein, line-cards 104 are provided with optical connectors and liquid connectors that couple to corresponding switch sub-chassis connectors and with electrical connectors that couple a line-card printed circuit board to the enclosure midplane. In other examples, the printed circuit boards of the line-cards may mate directly with the enclosure midplane.

Figure 14:
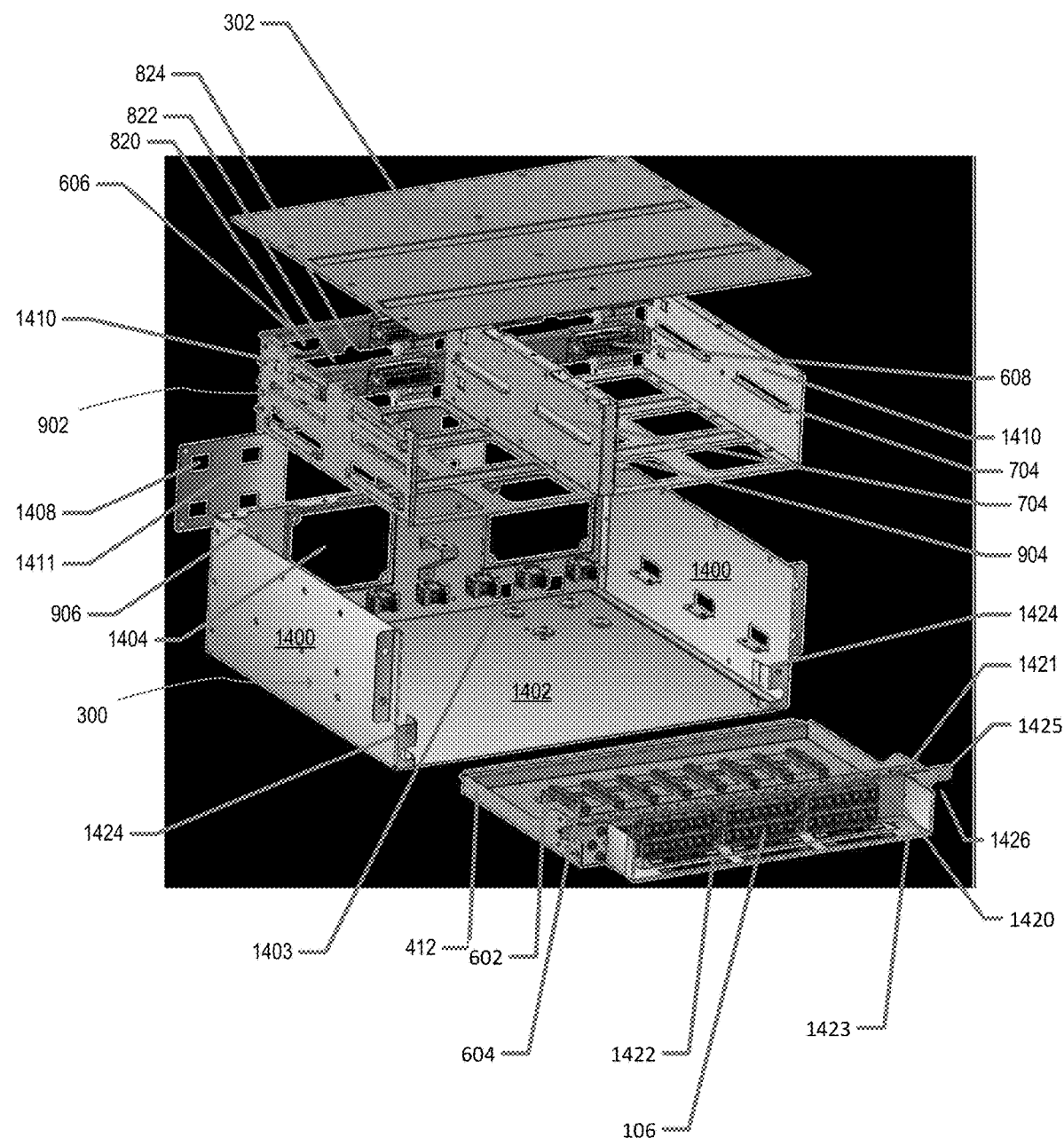
FIG. 14 illustrates an exploded perspective view of a switch sub-chassis, in accordance with various aspects of the disclosure.

FIG. 14 shows an exploded perspective view of a portion of switch sub-chassis 102. The example of FIG. 14 shows how switch sub-chassis 102 can be implemented as a modularly blindmateable switch sub-chassis that includes base pan 300 having two sidewalls 1400 and a front-end bulkhead 906 extending between the two sidewalls. A line-card cage assembly 902 may be coupled to and extend between the two sidewalls 1400. A fence bracket 606 may be attached to the line-card cage assembly 902. One or more optical blindmate connectors 608 may be attached to the fence bracket 606 (e.g., one for each of several line-card slots having guide features 704). One or more holes 820 can be seen in the fence brackets 606, the holes configured to allow pass-through of a line-card liquid blindmate connector 614. One or more notches 824 can also be provided in the fence bracket, the notches configured to allow pass-under of a line-card electrical connector 222 for direct blindmate of the line-card electrical connector to an enclosure midplane 506.

A fiber shuffle tray 412 having faceplate optical connectors 106 on a faceplate thereof may also be included. As described in further detail hereinafter (e.g., in connection with FIGS. 16 and 17), a liquid cooling system including liquid ports on the rear-end bulkhead 1424 near the faceplate 1420 can also be provided. Faceplate 1420, being a part of the shuffle tray 412, has ears 1425 for mechanical retention (e.g., using screws or other attachment members) to secure the faceplate 1420 on the rear-end bulkhead 1424. Faceplate 1420 has notches 1426 to clear the liquid ports 108 when the shuffle tray 412 is slid in the base pan 300, and retained on the rear-end bulkhead 1424. As described above in connection with, for example, FIG. 6, a sub-chassis management board 624 can be provided in the base pan, may have a connector 224 configured to directly electrically blindmate to the enclosure midplane, and may have a management controller 626 configured to communicate with an enclosure manager.

As can be seen in FIG. 14, when the line-card cage assembly 902 is installed in base pan 300, the line-card cage assembly provides structural support for the base pan. When attached to base pan 300 and/or line-card cage assembly 902, sub-chassis lid 302 encloses the line-card cage assembly 902 between sub-chassis lid 302 and a bottom surface 1402 of the base pan 300. FIG. 14 also shows a shuffle tray faceplate 1420 attached to the fiber shuffle tray 412 at a rear-end opening of the base pan 300. The rear end opening is on the opposite side of the front-end openings 1404. The front-end bulkhead 906 may have openings 1408 where removable plates 1411 may be attached to. The openings 1408 of the removable plates 1411 are for connectors 222 of line-cards 104 to go through. Front-end bulkhead 906 also includes openings 1403 for connectors 224 of switch sub-chassis 102 to go through. In this example, the line-card cage assembly and the fiber shuffle tray are arranged to be modularly installed within the base pan.

In the example of FIG. 14, line-card cage assembly 902 includes two side-by-side line-card cages 1410 and multiple bridge brackets 904 between the two side-by-side line-card cages 1410. The multiple bridge brackets 904 and the fence bracket(s) 606 attach the two side-by-side line-card 1410 cages together. As shown in FIG. 14, line-card guide features 704 are arranged to align, during installation of a line-card into the line-card cage assembly 902, line-card optical blindmate connectors on the line-card with optical blindmate connectors 608 on the fence bracket 606, and align the line-card electrical connector with an enclosure midplane electrical blindmate connector for direct blindmate of the line-card electrical connector to the enclosure midplane.

As shown, fiber shuffle tray 412 may include a faceplate lip 1421 for the line-card cage assembly to rest on. The faceplate 1420 may be configured for attachment of various optical faceplate connectors 106. A faceplate shelf 1423 may be attached to the faceplate 1420 for cable management and that includes connector labels 1422.

Figure 15:
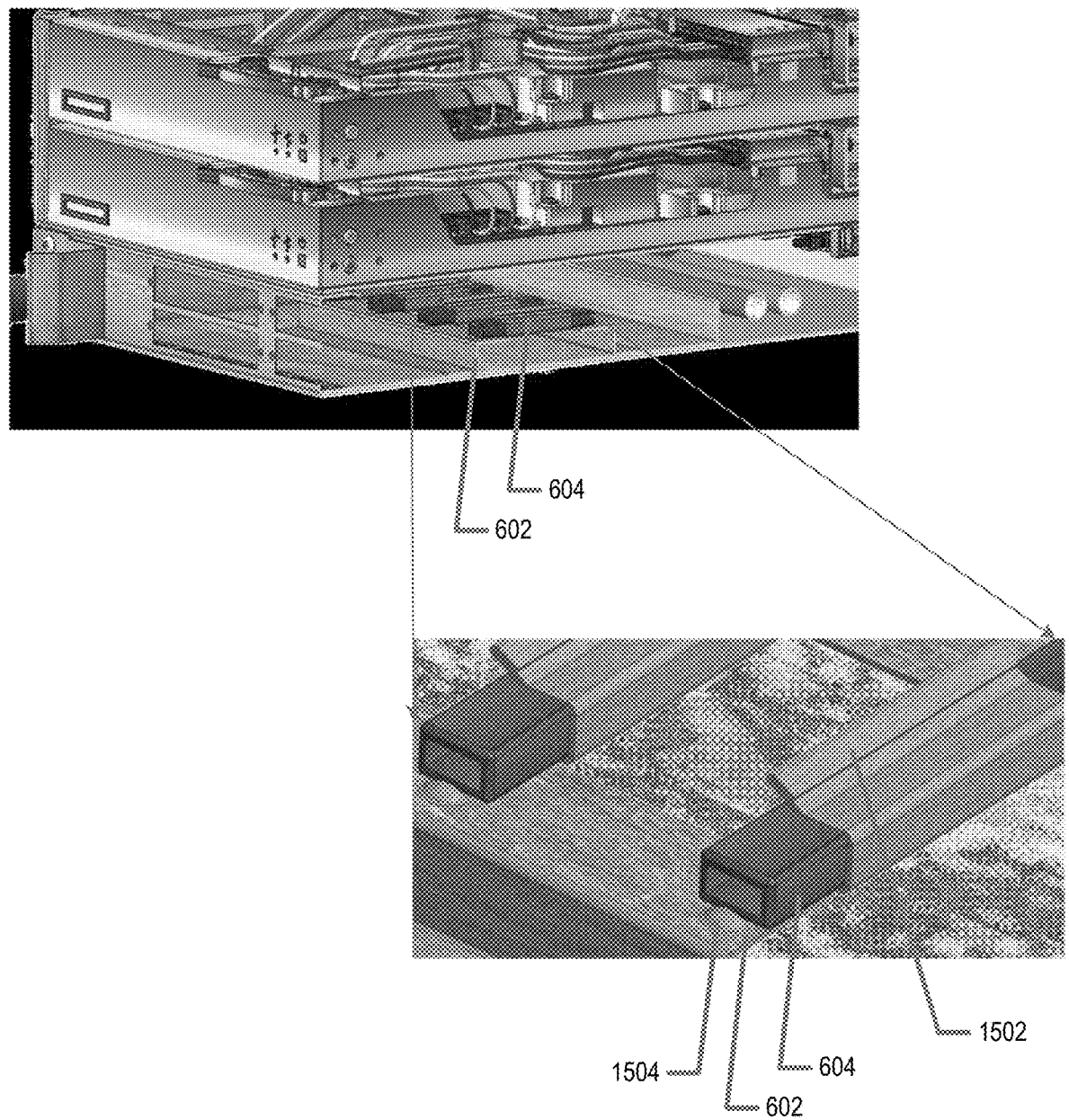
FIG. 15 illustrates a cutaway perspective view of a portion of a switch sub-chassis, in accordance with various aspects of the disclosure.

In the perspective view of FIG. 14, it can be seen that fiber shuffle tray 412 may include a shuffle stand 602 having multiple shuffle assemblies 604 (fibers off the shuffle assemblies are not shown for simplicity). FIG. 15 shows a perspective view of a portion of switch sub-chassis 102 in which multiple fiber shuffle assemblies 604 can be seen. Fibers off the fiber shuffle assemblies 604 are not shown for simplicity. FIG. 15 also shows an enlarged view of fiber shuffle assemblies 604 and a portion of shuffle stand 602. Each shuffle assembly 604 is configured to guide a plurality of fibers such as fibers 600 of FIG. 6 between various connectors within switch sub-chassis 102 (e.g., between faceplate optical connectors 108 on the faceplate of fiber shuffle tray 412 and optical blindmate connectors 608 attached to the fence bracket 606). As shown in FIG. 15, shuffle stand 602 may include clamps 1502 where each shuffle assembly 604 may be secured by a clamp 1502 with a finger tab for easy installation, servicing, and/or upgrading of the shuffle assemblies. Shuffle stand 602 may also include additional securement features such as shuffle box stops 1504 to prevent the shuffle assemblies 604 from sliding on the stand in a direction parallel to the clamps 1502. Each shuffle assembly 604 may also be provided with an identifier (not shown) such as an electronic tag (e.g., a radio-frequency identifier (RFID) tag). Shuffle stand 602 may be provided with tag readers (e.g., embedded in or attached to clamps 1502 or stops 1504) that are communicatively coupled to management controller 626 for monitoring and/or reporting of the contents and connection topology of switch 100. In this way, a fiber shuffle tray 412 having a plurality of fiber shuffle assemblies 604 that guide optical fibers 600 between various connectors of switch sub-chassis 102 can be provided in which each fiber shuffle assembly 604 includes a tag, and in which the sub-chassis management board 624 is coupled to a plurality of tag readers configured to detect installed fiber shuffle assemblies 604.

Figure 16:
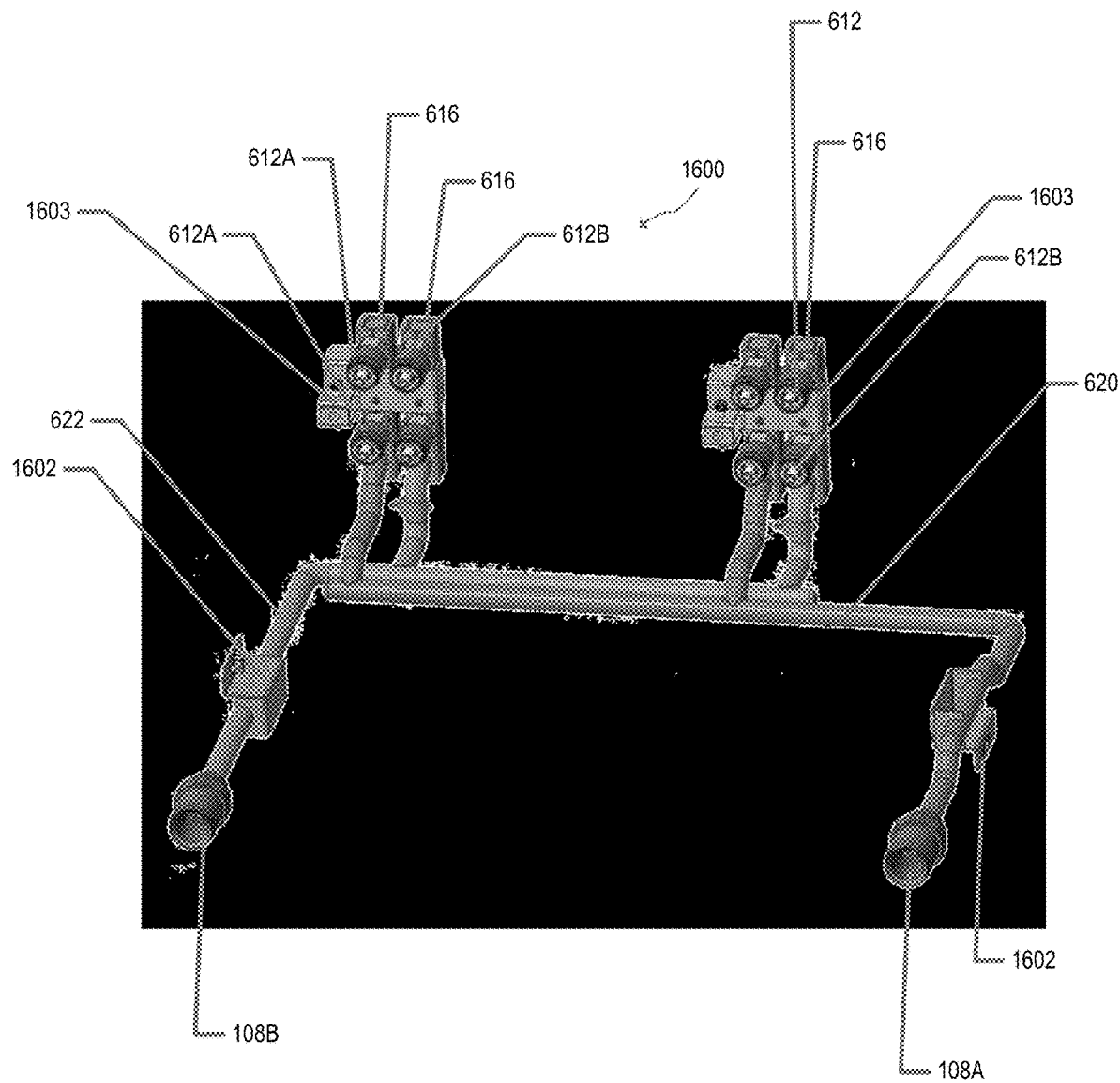
FIG. 16 illustrates a perspective view of a liquid line assembly for a switch sub-chassis, in accordance with various aspects of the disclosure.

FIG. 16 shows a perspective view of a liquid line assembly 1600 that can be modularly installed within the base pan 300 of switch sub-chassis 102. As shown in FIG. 16, liquid line assembly 1600 includes a liquid supply line 620 and a liquid return line 622 each terminated, at an interior end, at a liquid manifold 616 and, at an exterior end, with a detachable leak-proof liquid coupler (e.g., a quick disconnect) 108 for liquid interface to rack liquid lines 408 of a server rack 402. It can be seen in FIG. 16 that liquid couplers 108 include a supply line liquid coupler 108A and a return line liquid coupler 108B. As shown, the liquid manifold 616 at the interior end of the liquid supply line 620 and the liquid manifold 616 at the interior end of the liquid return line 622 each include a detachable leak-proof liquid coupler (e.g., a quick disconnect) 612 configured for liquid blindmate to multiple, vertically stacked line-cards 104 (e.g., to line-card liquid blindmate connectors 614 of the line-cards shown in FIGS. 6 and 8). It can be seen in FIG. 16 that liquid couplers 612 include supply line liquid couplers 612A and return line liquid couplers 612B. Side attachment members 1602 may be provided to attach portions of the liquid supply line 620 and the liquid return line to the side walls 1400 of base pan 300. Similarly, front attachment members 1603 may be provided to attach other portions of the liquid manifolds 616 on the front-end bulkhead 906 of base pan 300.

Figure 17:
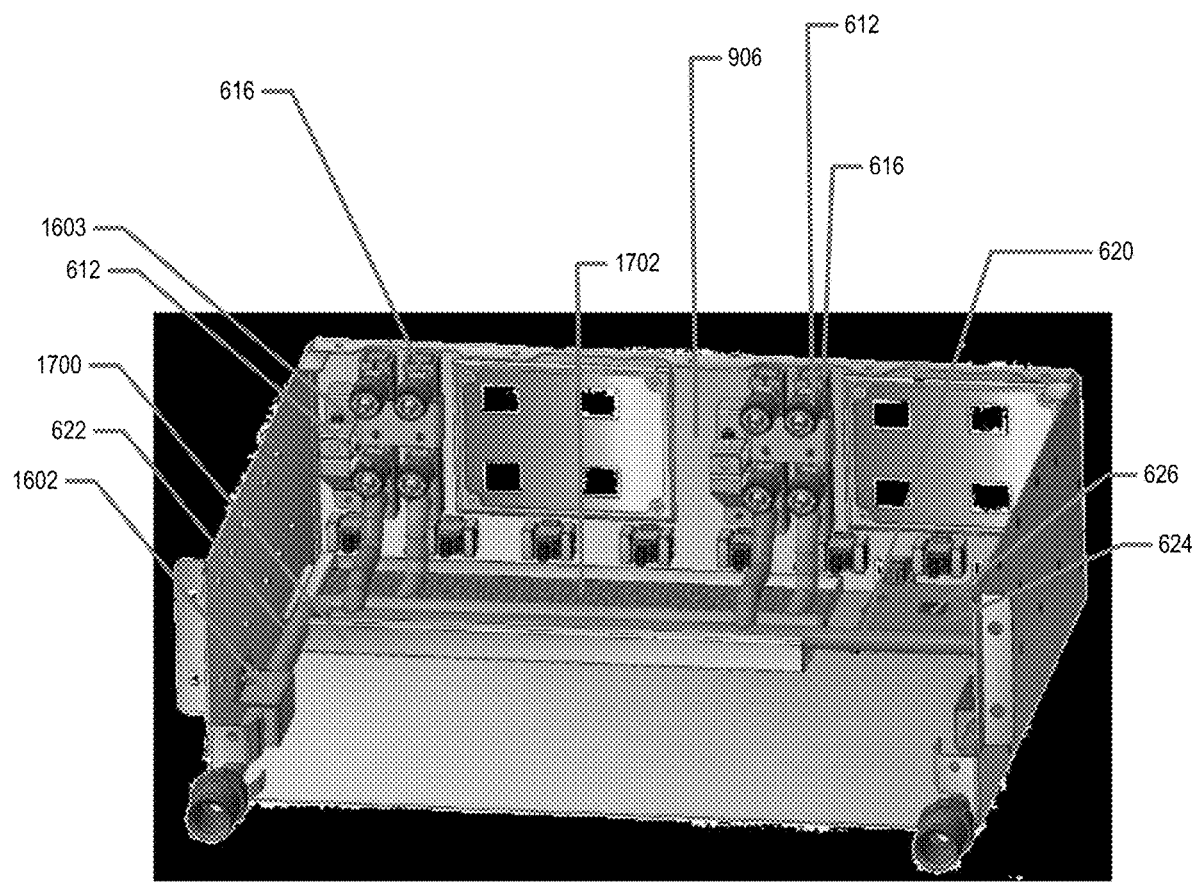
FIG. 17 illustrates a perspective view of the liquid line assembly of FIG. 16 modularly installed in a base pan, in accordance with various aspects of the disclosure.

FIG. 17 shows liquid line assembly 1600 of FIG. 16 modularly installed in base pan 300 using side attachment members 1602. It can be seen in FIG. 17 that liquid manifolds 616 of liquid line assembly 1600 are modularly attached to the front-end bulkhead 906 of base pan 300 by means of front attachment members 1603. FIG. 17 also shows a drip pan 1700 disposed in the base pan 300 and extending under the liquid manifolds 616. A liquid sensor 1702, such as a sensor rope, may be provided in drip pan 1700 and communicatively coupled to sub-chassis management board 624 and management controller 626.

Figure 18:
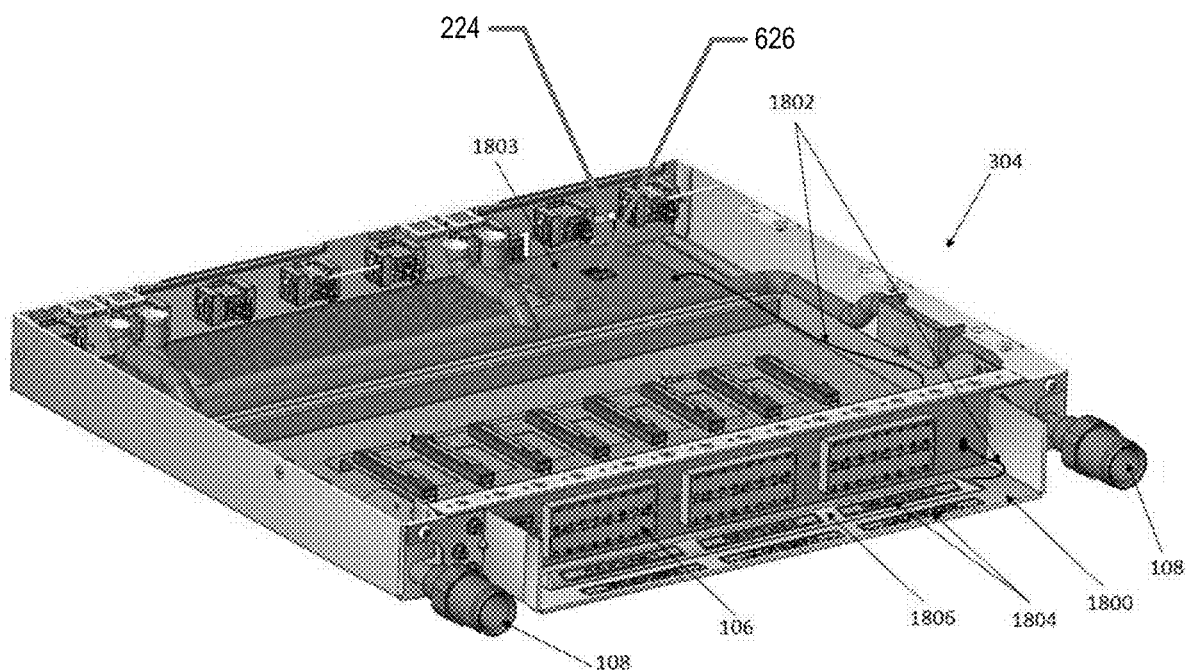
FIG. 18 illustrates a top perspective view of a fiber shuffle tray, in accordance with various aspects of the disclosure.

FIG. 18 shows how a faceplate shelf 1800 for fiber shuffle tray 412 may be provided with connectors 106 and labels 1804 that are backlit by an embedded illuminator 1806 (e.g., a light pipe that opto-mechanically couples to a light source such as a light-emitting diode) that is controlled by management controller 626 via indicator wires 1802 that extend between management board 624 (e.g., having a top surface 1803) and the illuminator 1806.

Figure 19:
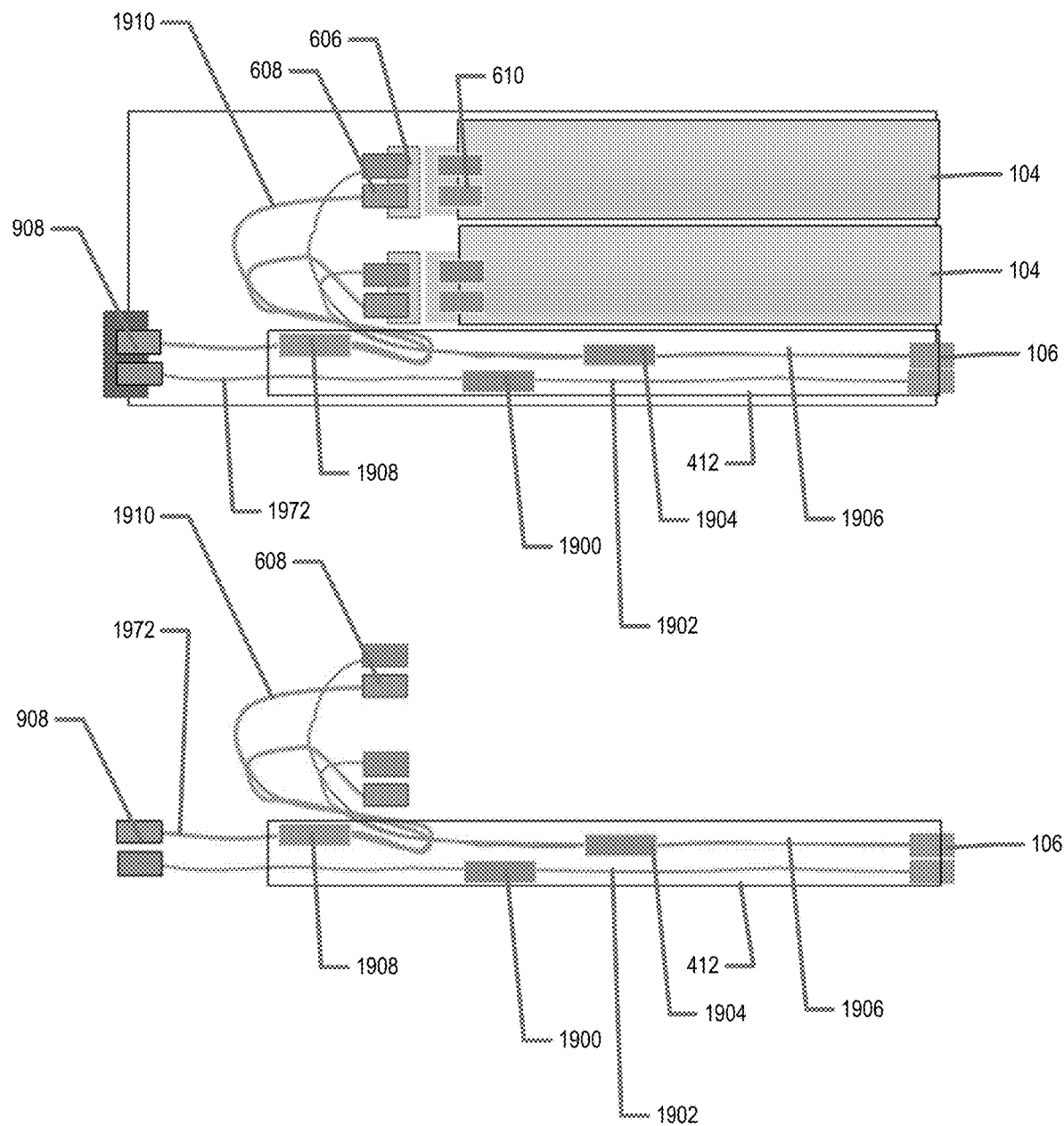
FIGS. 19 and 20 each illustrate a schematic side view of an exemplary fiber shuffle arrangement for a switch sub-chassis, in accordance with various aspects of the disclosure.
Figure 20:
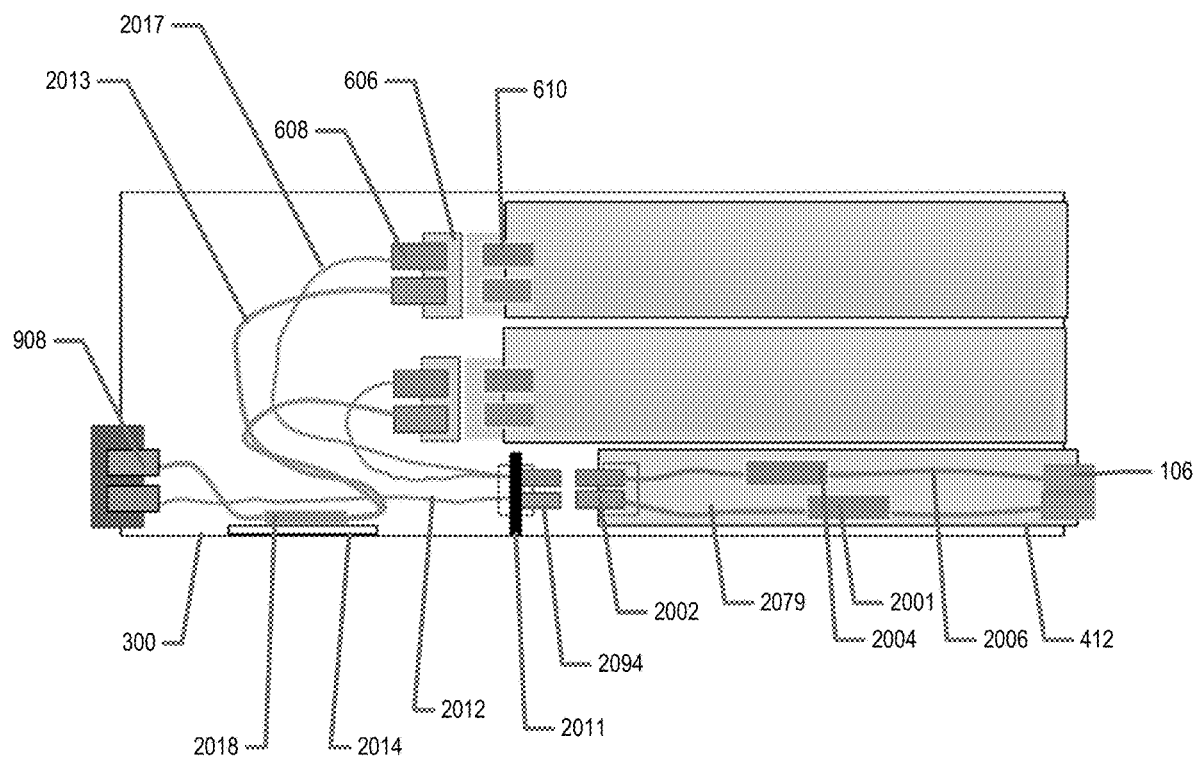
Figure 20:
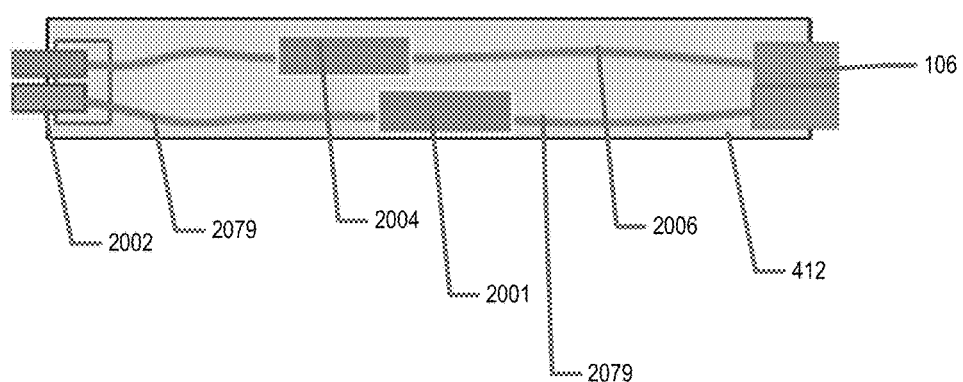

As discussed above in connection with, for example, FIG. 10, fiber shuffle tray 412 may be a serviceable fiber shuffle tray. FIGS. 19 and 20 schematically illustrate arrangements of the fiber shuffle assemblies of fiber shuffle tray 412 (with other features of the fiber shuffle tray, the switch sub-chassis, and line-card omitted for clarity) that can be used to provide various levels of serviceability for fiber shuffle tray 412. For example, FIGS. 19 and 20 show different exemplary arrangements of fiber shuffle assemblies that guide optical fibers between various optical connectors of a modularly blindmateable switch sub-chassis.

In the example of FIG. 19, a fiber shuffle tray 412 that is removable during the initial setup of a switch 100 is illustrated in which a fiber shuffle assembly 1900 guides fibers 1902 between faceplate optical connectors 106 and front-end bulkhead optical connectors 908, a fiber shuffle assembly 1904 guides fibers 1906 between faceplate optical connectors 106 and fence bracket optical connectors 608, and a fiber assembly 1908 guides fibers 1910 between front-end bulkhead optical connectors 908 and fence bracket optical connectors 608. In this example, each of fiber assemblies 1900, 1904, and 1908 may be mounted to a shuffle stand mounted on the floor of fiber shuffle tray 412.

As shown, fiber shuffle tray 412 may include dangling fiber shuffle portions 1972 that extend from a front end of a shuffle tray 412 having faceplate connectors 106 at the rear end. In FIG. 19, a first fiber shuffle tray 412 is shown installed in the sub-chassis and a second fiber shuffle tray 412 is shown separately from the sub-chassis for clarity.

FIG. 20 illustrates another arrangement for a fully serviceable, removable and self-contained (e.g., pluggable) fiber shuffle tray 412 having faceplate connectors 106 at the rear end. In the example of FIG. 20, fiber shuffle tray 412 encloses shuffle assemblies 2001 and 2004 that guide internal fibers 2079 and 2006 between faceplate connectors 106 and tray blindmate connectors 2002. Tray blindmate connectors 2002 in this configuration blindmate to switch sub-chassis shuffle-tray blindmate optical connectors 2094, which may be mounted to a bracket 2011 on base pan 300. In the configuration illustrated in FIG. 20, fibers 2012 within the switch sub-chassis and separate from fiber shuffle tray 412 may extend directly between front-end bulkhead optical blindmate connectors 908 and switch sub-chassis shuffle-tray blindmate optical connectors 2094. Fibers 2017 within the switch sub-chassis and separate from fiber shuffle tray 412 may extend directly between fence bracket optical blindmate connectors 608 and switch sub-chassis shuffle-tray blindmate optical connectors 2094. A separate shuffle assembly 2018 mounted to a shuffle stand 2014 (mounted on the floor of base pan 300) guides fibers 2013 between optical blindmate connectors 608 mounted on fence brackets 606 and front-end bulkhead optical blindmate connectors 908.

It should be appreciated that, in either of the arrangements of FIG. 19 or 20, additional fiber assemblies may be provided to guide fibers among a set of fence bracket optical blindmate connectors 608 and/or among a set of front-end bulkhead optical blindmate connectors 908.

According to some aspects of the present disclosure, a modularly blindmateable switch sub-chassis is provided that includes a base pan having two sidewalls and a front-end bulkhead extending between the two sidewalls, a line-card cage assembly coupled to and extending between the two sidewalls, a fence bracket attached to the line-card cage assembly, at least one optical blindmate connector attached to the fence bracket, at least one hole in the fence bracket configured to allow pass-through of a line-card liquid blindmate connector, at least one notch in the fence bracket configured to allow pass-under of a line-card electrical connector for direct blindmate of the line-card electrical connector to an enclosure midplane, a fiber shuffle tray having a plurality of faceplate optical connectors on a faceplate, a liquid cooling system including liquid ports at a rear-end bulkhead near the faceplate, and a sub-chassis management board having a connector configured to directly electrically blindmate to the enclosure midplane and having a management controller configured to communicate with an enclosure manager.

According to other aspects of the present disclosure, a modularly blindmateable switch sub-chassis is provided that includes a base pan, a line-card cage assembly having a plurality of line-card slots for serviceably receiving a plurality of line-cards, a fence bracket attached to the line-card cage assembly, and a liquid line assembly modularly installed within the base pan, the liquid line assembly having a liquid supply line and a liquid return line each terminated, at an interior end, at a liquid manifold that is modularly attached to a front-end bulkhead of the base pan and, at an exterior end, with a detachable leak-proof liquid coupler for liquid interface to rack liquid lines of a server rack. The liquid manifold at the interior end of the liquid supply line and the liquid manifold at the interior end of the liquid return line each include a detachable leak-proof liquid coupler configured for liquid blindmate to one of the plurality of line-cards.

According to other aspects of the present disclosure, a modularly blindmateable switch sub-chassis is provided that includes a sub-chassis management board having a management board connector for direct blindmate to a midplane of an enclosure, a fiber shuffle tray having a plurality of faceplate optical connectors on a faceplate, a plurality of line-card slots each including optical blindmate connectors and liquid blindmate connectors for a line-card, liquid ports near the faceplate fluidly coupled to the liquid blindmate connectors for the line-cards, and a plurality of fibers coupled between the faceplate optical connectors and the optical blindmate connectors for each of the plurality of line-card slots.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference. Furthermore, to the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." Pronouns in the masculine (e.g., his) include the feminine and neuter gender (e.g., her and its) and vice versa. The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for".

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A modularly blindmateable switch sub-chassis, comprising:
   a base pan having two sidewalls and a front-end bulkhead extending between the two sidewalls;
   a line-card cage assembly coupled to and extending between the two sidewalls;
   a fence bracket attached to the line-card cage assembly;
   at least one optical blindmate connector attached to the fence bracket;
   at least one hole in the fence bracket configured to allow pass-through of a line-card liquid blindmate connector;
   at least one notch in the fence bracket configured to allow pass-under of a line-card electrical connector for direct blindmate of the line-card electrical connector to an enclosure midplane;
   a fiber shuffle tray having a plurality of faceplate optical connectors on a faceplate;
   a liquid cooling system including liquid ports alongside the faceplate; and
   a sub-chassis management board having a connector configured to directly electrically blindmate to the enclosure midplane and having a management controller configured to communicate with an enclosure manager.

2. The modularly blindmateable switch sub-chassis of claim 1, further comprising:
   at least one mechanical retention feature on a rear-end of each of the two sidewalls;
   at least one optical blindmate connector attached to the front-end bulkhead; and
   at least one sub-chassis initial alignment feature on the front-end bulkhead;
   wherein the line-card cage assembly provides structural support for the base pan.

3. The modularly blindmateable switch sub-chassis of claim 1, further comprising a sub-chassis lid enclosing the line-card cage assembly between the sub-chassis lid and a bottom surface of the base pan.

4. The modularly blindmateable switch sub-chassis of claim 1, wherein the faceplate is secured to a rear-end bulkhead of the base pan, and wherein the line-card cage assembly and the fiber shuffle tray are modularly installed within the base pan.

5. The modularly blindmateable switch sub-chassis of claim 1, wherein the line-card cage assembly comprises two side-by-side line-card cages and multiple bridge brackets between the two side-by-side line-card cages, and wherein the multiple bridge brackets and the fence bracket attach the two side-by-side line-card cages together.

6. The modularly blindmateable switch sub-chassis of claim 1, wherein the line-card cage assembly comprises line-card guide features that, during installation of a line-card into the line-card cage assembly, align line-card optical blindmate connectors on the line-card with the at least one optical blindmate connector on the fence bracket, and align the line-card electrical connector with an enclosure midplane electrical blindmate connector for direct blindmate of the line-card electrical connector to the enclosure midplane.

7. The modularly blindmateable switch sub-chassis of claim 1, wherein the fiber shuffle tray comprises at least one shuffle stand having a plurality of shuffle assemblies, each shuffle assembly configured to guide a plurality of fibers between the plurality of faceplate optical connectors on the faceplate and the at least one optical blindmate connector attached to the fence bracket.

8. The modularly blindmateable switch sub-chassis of claim 7, wherein:
   the fiber shuffle tray further comprises a faceplate shelf that is configured for cable management and that includes connector labels; and
   the faceplate shelf further comprises an illuminator for the connector labels.

9. The modularly blindmateable switch sub-chassis of claim 1, wherein the base pan includes:
   initial alignment features for mechanical blindmate of the base pan to the enclosure midplane; and
   mechanical retention features for securing the base pan to a main chassis.

10. The modularly blindmateable switch sub-chassis of claim 1, wherein the fiber shuffle tray is a serviceable fiber shuffle tray.

* * * * *